United States Patent
Qian et al.

(10) Patent No.: US 12,100,662 B2
(45) Date of Patent: Sep. 24, 2024

(54) POWER-FORWARDING BRIDGE FOR INTER-CHIP DATA SIGNAL TRANSFER

(71) Applicant: Intel Corporation, Santa Clara, CA (US)

(72) Inventors: Zhiguo Qian, Chandler, AZ (US); Gerald Pasdast, San Jose, CA (US); Peipei Wang, San Jose, CA (US); Daniel Krueger, Fort Collins, CO (US); Edward Burton, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 766 days.

(21) Appl. No.: 17/127,304

(22) Filed: Dec. 18, 2020

(65) Prior Publication Data
US 2022/0199537 A1    Jun. 23, 2022

(51) Int. Cl.
| | | |
|---|---|---|
| H01L 23/538 | (2006.01) | |
| H01L 21/50 | (2006.01) | |
| H01L 23/50 | (2006.01) | |
| H01L 25/065 | (2023.01) | |

(52) U.S. Cl.
CPC .......... H01L 23/5381 (2013.01); H01L 21/50 (2013.01); H01L 23/50 (2013.01); H01L 23/5385 (2013.01); H01L 23/5386 (2013.01); H01L 25/0657 (2013.01)

(58) Field of Classification Search
CPC . H01L 23/5381; H01L 23/50; H01L 23/5385; H01L 23/5386; H01L 21/50; H01L 25/0657
See application file for complete search history.

(56) References Cited

U.S. PATENT DOCUMENTS

| | | |
|---|---|---|
| 8,546,955 B1 | 10/2013 | Wu |
| 10,847,467 B2 | 11/2020 | Collins et al. |
| 2012/0216084 A1* | 8/2012 | Chun ................ H04W 52/0209 714/708 |

(Continued)

FOREIGN PATENT DOCUMENTS

| | | |
|---|---|---|
| KR | 10-2019-0061362 | 6/2019 |
| KR | 10-2019-0139746 | 12/2019 |

OTHER PUBLICATIONS

International Search Report and Written Opinion for PCT Application No. PCT/US2021/051521, dated Jan. 14, 2022.

(Continued)

*Primary Examiner* — Peniel M Gumedzoe
(74) *Attorney, Agent, or Firm* — Essential Patents Group, LLP

(57) ABSTRACT

An integrated circuit (IC) package, comprising a substrate that comprises a bridge die embedded within a dielectric. A first die comprising a first input/output (I/O) transmitter and a second die comprising a second I/O receiver and electrically coupled to the bridge die. A first signal trace and a first power conductor are within the bridge die. The first signal trace and the first power conductor are electrically coupled to the first I/O transmitter and the second I/O receiver. The first signal trace is to carry a digital signal and the first power conductor to provide a voltage for the second I/O receiver to read the digital signal.

25 Claims, 14 Drawing Sheets

(56) References Cited

U.S. PATENT DOCUMENTS

| | | | |
|---|---|---|---|
| 2014/0293710 A1* | 10/2014 | Ware | G11C 29/022 |
| | | | 365/194 |
| 2017/0301625 A1 | 10/2017 | Mahajan et al. | |
| 2018/0240778 A1 | 8/2018 | Liu et al. | |
| 2019/0131268 A1* | 5/2019 | Hossain | H01L 24/18 |
| 2019/0164910 A1 | 5/2019 | Roh | |
| 2019/0252321 A1* | 8/2019 | Braunisch | H01L 25/065 |
| 2019/0304911 A1* | 10/2019 | Collins | H01L 21/4853 |
| 2019/0378809 A1 | 12/2019 | Chen et al. | |
| 2020/0243448 A1 | 7/2020 | Qian et al. | |

OTHER PUBLICATIONS

International Preliminary Report on Patentability from PCT/US2021/051521 notified Jun. 29, 2023, 8 pgs.

National Search Report and Written Opinion for Dutch Patent Application No. 2029743, dated Mar. 27, 2023.

* cited by examiner

POWER-FORWARDING BRIDGE FOR INTER-CHIP DATA SIGNAL TRANSFER

BACKGROUND

In recent years, an increasing need for a high memory bandwidth between a processor (e.g., a CPU) and memory has helped to drive interest for low power, high bandwidth on-package data I/O links. Other multi-chip package (MCP) applications, such as chiplet integration, also require high-bandwidth on-package links. Current die-to-die I/O circuits require dedicated power supplies for their transmitters and receivers, located on separate chips. Numbers of linked dies requiring high-bandwidth links within a MCP are growing as packaging technologies evolve. As die-to-die I/O is used at various locations in a die complex, providing dedicated power circuitry for each transmitter and receiver poses important challenges. Including additional power rails to drive I/O transceiver circuits may increase power routing complexity, increase power consumption and cause degradation of signal integrity, resulting in lowers signal bandwidth. One solution is to employ local digital power rails. However, in modern processors, dies may operate at different frequencies and voltage levels, resulting in a common mode voltage difference between transmitter and receiver circuits. As a consequence, significant eye margin loss may result, degrading I/O signal reception fidelity.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
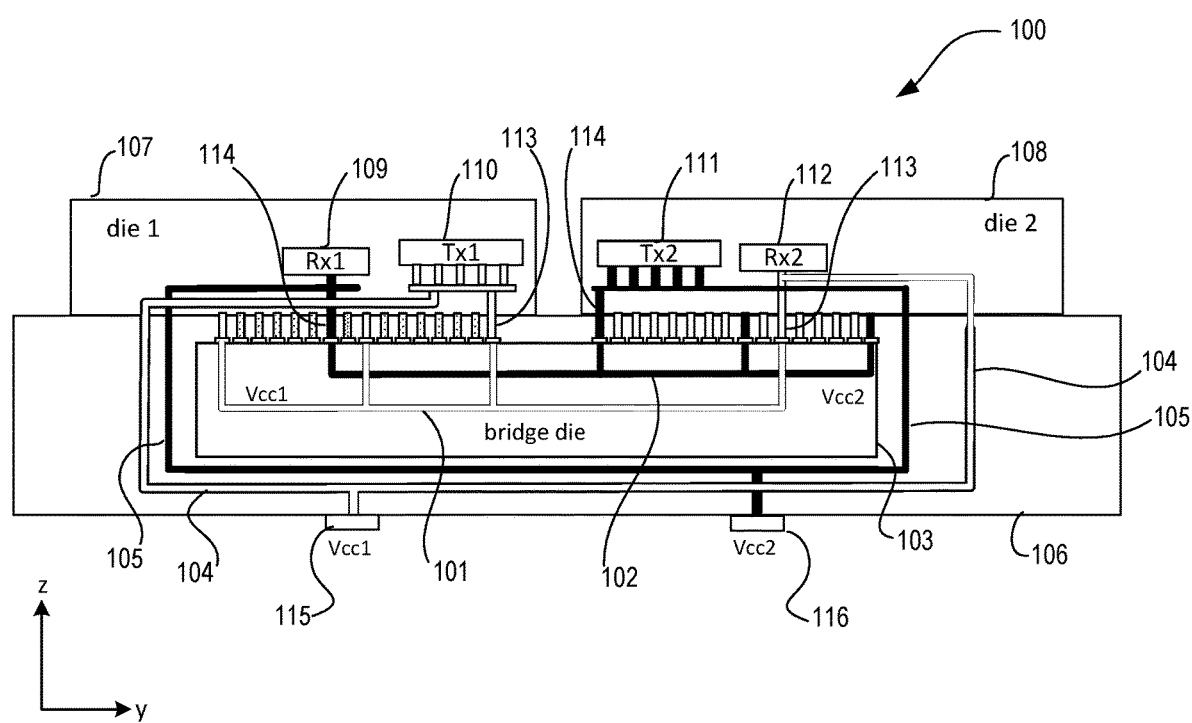
FIG. 1 illustrates a cross-sectional schematic view of an IC package, comprising a power-forwarding bridge die, according to some embodiments of the disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Here, the term "circuit" or "module" may refer to one or more passive and/or active components that are arranged to cooperate with one another to provide a desired function. The term "signal" may refer to at least one current signal, voltage signal, magnetic signal, or data/clock signal.

Here, the term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to a printed circuit board (PCB).

The meaning of "a," "an," and "the" include plural references. The meaning of "in" includes "in" and "on." The vertical orientation is in the z-direction and it is understood that recitations of "top", "bottom", "above" "over" and "below" refer to relative positions in the z-dimension with the usual meaning. Generally, "top", "above", and "over" refer to a superior position on the z-dimension, whereas "bottom", "below" and "under" refer to an inferior position on the z-dimension. The term "on" is used in this disclosure to indicate that one feature or object is in a superior position relative to an inferior feature or object, and in direct contact therewith. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Described herein is a package architecture comprising bridge layers embedded within a package substrate to route transmitter (Tx) power supply output on a first die to the receiver (Rx) on a second die having an I/O link to the first die in the same package. An example is a CPU and a memory chip included in a MCP package. Power forwarded in such a manner from one die to another, along with dense signal routing may enable simplification of voltage regulator design and power routing structure on multiple linked dies, where the need for extra dedicated power rails on each chip may be obviated. The bridge layer may be in the form of an embedded bridge die, such as an embedded multidie interconnect bridge (EMIB), that comprises high density I/O routing as well as power forwarding rails between linked dies on a common substrate. While exemplary implementations of the disclosed power-forwarding bridge architecture are described for embedded bridges such as EMIB packages, the disclosed transceiver to transceiver power-forwarding I/O bridge layer may be implemented in other package architectures comprising silicon interposers, fan-out wafer-level package technologies (e.g., within redistribution layers), integrated fan-out (InFO) package technologies, standard organic packaging, as well as other packaging technologies not listed here.

Specifically, power forwarding routing may include multiple power nets operating on different voltages, arranged in multiple layers of the bridge die. The trace layout of each net in a particular bridge die layer may include traces from each net sharing the same layers, where traces from each power net may be lain side by side. Traces of a particular net that run in different layers may be stitched together by interlayer vias. As an example, two power nets may be present within the bridge die, one net coupled to a Vcc1 source, and a second net coupled to a Vcc2 source. Vcc1 and Vcc2 may respectively correspond to I/O transceiver voltage levels on two dies, die 1 and die 2. I/O transceivers may be labelled as Tx1/Rx1 and Tx2/Rx2, corresponding to I/O transceivers on die 1 and die 2. The signaling may be uni-directional (i.e. TX only driving bumps and RX only receiving bump) or may be bi-directional (i.e. TX and RX on the same bump). Die 1 may generally operate at Vcc1 for all of its circuits therefore having a local power source regulated at Vcc1, whereas die 2 may generally operate at Vcc2, thereby comprising voltage regulation circuitry maintaining a voltage of Vcc2 on its power rails.

Vcc1 and Vcc2 may differ significantly, Vcc1 may be 1.0V, whereas Vcc2 may be 0.6V. Signal output from Tx1 and sent to Rx2 has a logical HI level of about 1V for "1" bits, while logical HI for Rx2 is 0.6V. HI bits from Tx1 having amplitudes above 0.6V may cause duty cycle distortion at the output of Rx2 (due to 0.5V as the trip points from LOW to HI and HI to LOW from the incoming 1.0V swinging TX into the RX whose trip point may either be 0.3V naturally, but if set to 0.5V might cause supply headroom issues for the RX circuit and either malfunction or duty cycle distortion at the output with reduced performance), which in turn might fail to be captured at the sampler which follows it (which would lead to having to reduce signal frequency until it works). Depending on the transistor RC time constant, Rx2 input may not settle to Vss before Tx1 sends a logical LO, or Vss level bit. As a result, the eye pattern margin may be reduced. Due to reduced eye margin, the LO (zero) bit may be misread as a HI (1) bit. Data errors such as a misread by Rx2 of bits sent from Tx1 increase the bit error rate (BER) of the device. To accommodate the voltage differential, Rx2 may be coupled to the Vcc1 net. Level shifting circuitry onboard die 2 may drive Rx2 at Vcc1 (e.g., 1V) during I/O cycles, eliminating overdriving of Rx2 and signal distortion, enabling high fidelity reception of I/O signals emanating from Tx1.

The converse is true for data flowing in the opposite direction, from Tx2 to Rx1. Rx1 operating at Vcc1, or 1V following the example, may interpret logical LO bits as any signal having an amplitude of 0.5V or less. However, HI bits emanating from Tx2 operating at Vcc2 (e.g., 0.6V) may have a maximum amplitude of 0.6V (e.g., Vcc2). Due to phase jitter and amplitude noise, many of the HI bits in the data stream emanating from Tx2 may not make the threshold or cause severe duty cycle distortion or failure of achieving trip of the RX circuitry, again causing reading errors that reduce reception fidelity by Rx1 or reduce capable frequency performance (i.e. reduced frequency of operation).

In a manner analogous to data transfer from die 1 to die 2, the Vcc2 power forwarding net on the disclosed bridge die may be coupled to Tx2 on die 2 and Rx1 on die 1 to significantly mitigate any BER due to the interdie voltage level differential. By coupling Vcc2 to Rx1, Rx1 may operate at Vcc2 by level shifting of Vcc1 to Vcc2 during I/O transmission cycles. Thus, high fidelity data transfer from die 2 to die 1 may be enabled, mitigating the above-noted bit reading errors.

According to some embodiments, power forwarding nets, including Vcc1, Vcc2, Vss, etc., may also be routed within the package substrate adjacent to the bridge die. Extra-die routing may be coupled to the bridge die, for example coupling power into the bridge die from a mother board power supply. The extra-die routing may also be directly coupled to attached dies, for example die 1 and die 2. In some high-power device implementations, extra-die power nets may supplement the internal power nets within the bridge die.

Embodiments of the disclosed bridge die comprise multiple metallization layers wherein traces from the power forwarding net are vertically stacked. As noted, at each level traces from different nets may be adjacent to one another. For example, routing layouts for different layers may include Vcc1 traces laterally adjacent to Vcc2 traces, with a Vss trace in between. Within the same power net, vertically adjacent traces may have different widths. For example, while traces from each power and ground net may be laid out adjacently in a particular order in multiple layers (e.g., in the order of Vcc1, Vss, Vcc2) a Vss trace in a first layer may have a first width that is different from a second width in a second layer. At the same time, Vcc1 and Vcc2 traces flanking the Vss trace may be wider in the second layer than corresponding traces in the first layer. The vertically differing trace widths may reduce loop inductance.

In addition to power and ground nets, bridge die metallization may comprise signal traces for uni-directional interdie data transfer on dedicated layers. Signal traces may be significantly narrower than power traces for enabling high density traffic, and include non-signal traces interspersed between adjacent signal-carrying traces (e.g., every third trace is tied to Vss) to reduce lateral cross-talk. The dedicated layers may be separate from layers containing power traces, in order to mitigate coupling between signals and power routing. In some embodiments, separate bridge die layers may be each dedicated to one-way signal routing. For example, a layer stacked below power net layers may comprise multiple I/O traces carrying signals from die 1 to die 2, while another layer lower in the layer stack may comprise multiple I/O traces carrying signals from die 2 to die 1. To mitigate vertical cross-talk between the two sets of I/O trace routing, in some embodiments a ground plane is included on a layer intervening between Tx1-to-Rx2 I/O layer and the Tx2-to-Rx1 I/O layer.

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1 illustrates a cross-sectional schematic view of package 100, comprising power-forwarding bridge (PFB) die 103, according to some embodiments of the disclosure.

Figure 4A:
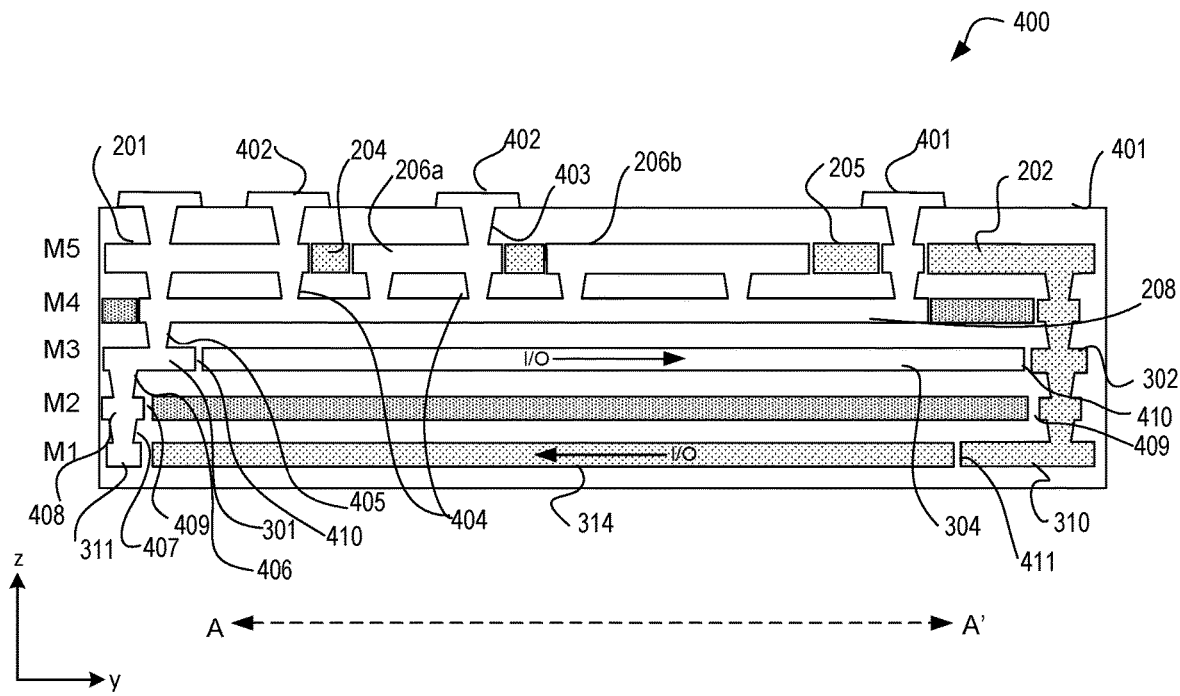
FIG. 4A illustrates a cross-sectional view in the y-z plane of a Vcc1 power net in a power-forwarding bridge die, showing vertical interconnections between Vcc1 metallization structures in power-forwarding bridge die layers, according to some embodiments of the disclosure.
Figure 4B:
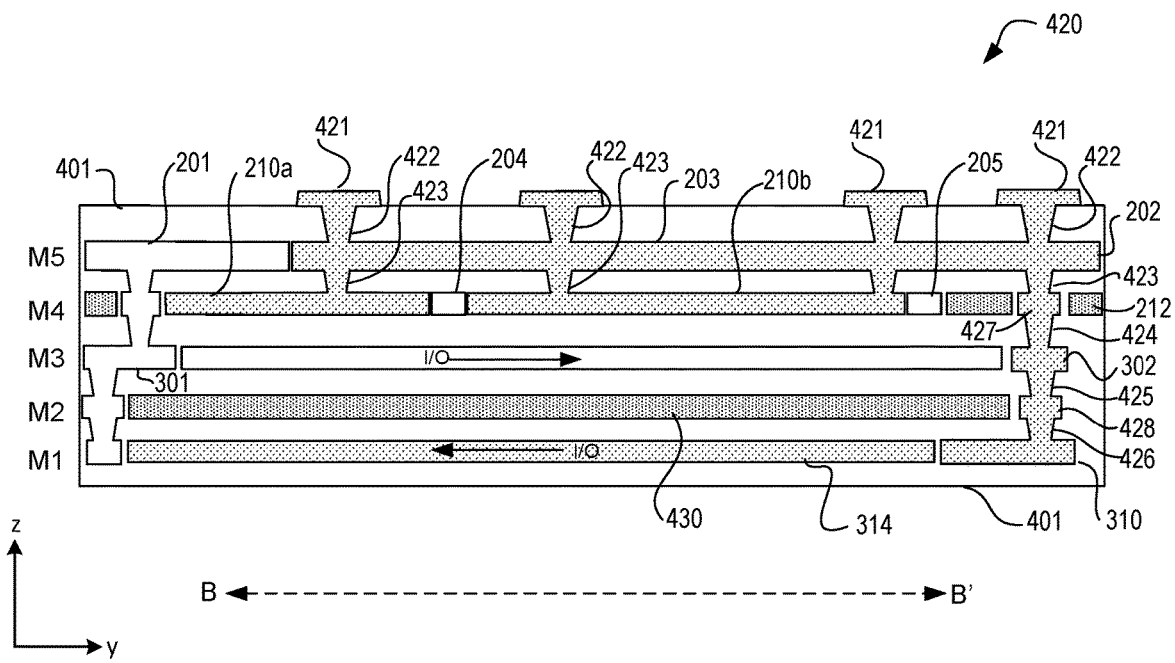
FIG. 4B illustrates a cross-sectional view in the y-z plane of a Vcc2 power net of a power-forwarding bridge die, showing vertical interconnections between Vcc2 metallization structures in power-forwarding bridge die layers, according to some embodiments of the disclosure.
Figure 4C:
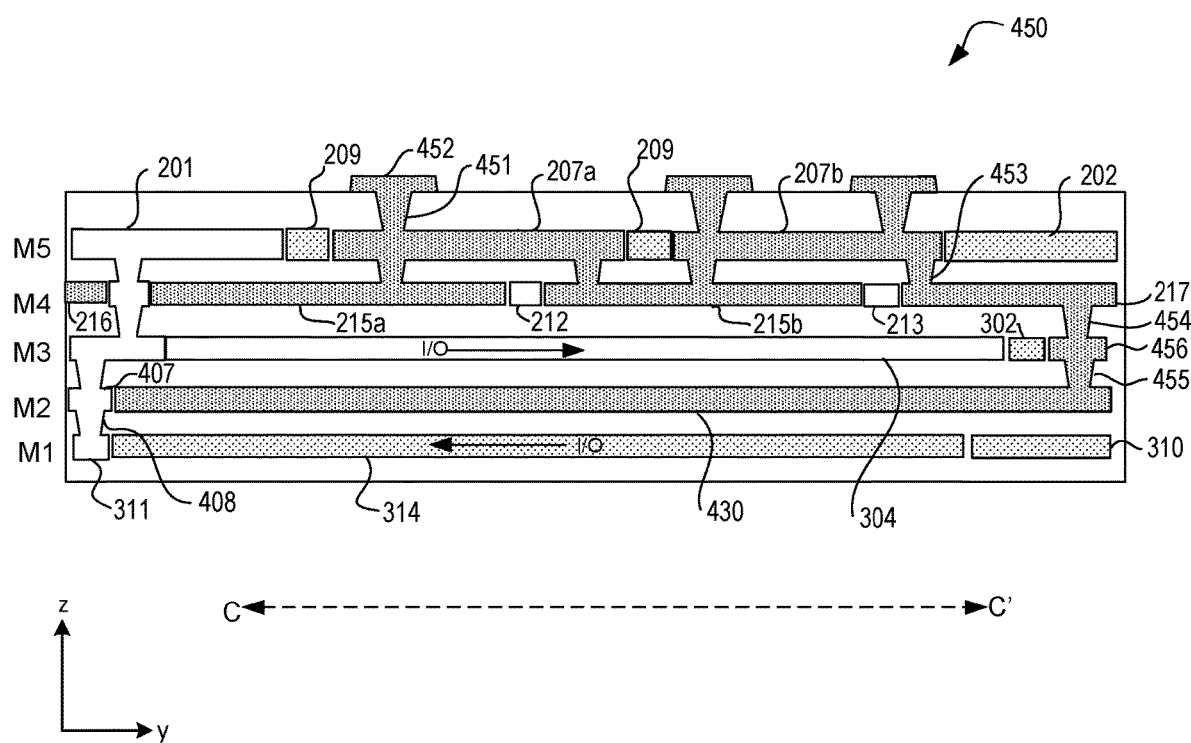
FIG. 4C illustrates a cross-sectional view in the y-z plane of a Vss power net of a power-forwarding bridge die, showing vertical interconnections between Vss metallization structures in power-forwarding bridge die layers, according to some embodiments of the disclosure.

Vcc1 and Vcc2 power forwarding nets 101 and 102, respectively, within PFB die 103 and extra-die Vcc1 and Vcc2 power-forwarding nets 104 and 105, respectively within substrate 106 are represented schematically to show the principal routing. I/O and Vss (e.g., ground) nets are also present but omitted in the figure for clarity. All power and I/O signal nets are shown in physical detail in subsequent figures. While in the schematic view of FIG. 1 Vcc1 and Vcc2 power nets 101 and 102, respectively, appear at vertical (e.g., z) heights within PFB die 103 (e.g., as is shown in FIGS. 4A-4C, for example), they may share the same physical layer and thus vertical level within PFB die 103. Power net routing 101 and 102 couple to transceiver circuitry within attached dies 107 and 108, respectively. Transceiver circuitry comprises Rx 109 and Tx 110 in die 107, Tx 111 and Rx 112 in die 108. Power ports (e.g., shown in FIG. 7) for Rx 109 on die 107 and Tx 111 on die 108 are electrically coupled to Vcc1 power nets 101 and 104 through vertical interconnects 113. Power ports (e.g., shown in FIG. 7) for Tx 111 on die 108 and Rx 109 on die 107 are electrically coupled to Vcc2 power nets 102 and 105 through interconnects 114.

Package 100 may be a MCP package comprising multiple dies. Dies 107 and 108 represent two or more linked dies within package 100. Dies 107 and 108 may be linked to one another through I/O routing (not shown) and power-forwarding routing 101 and 102 within PFB die 103. An example is two microprocessor (CPU) chiplets linked to each other through PFB die 103 embedded in substrate 106. Substrate-level power nets 104 and 105 may be incorporated into metallization layers of substrate 106, which may comprise copper metallization layers interleaved with organic dielectric laminate layers. Inorganic and composite materials such as ceramics may be employed as isolation layers between metallization layers.

A schematic representation of substrate-level power net routing 104 and 105 within substrate 106 is also shown in FIG. 1. Vertical separation of the two nets is not necessarily indicative of physical distribution of the substrate-level power routing within substrate 106. Some of the routing of both substrate-level power forwarding nets 104 and 105 may share the same metallization layers.

Land interconnect pads 115 and 116 may provide surface mount coupling to a printed circuit board (PCB), where power may be coupled to extra-die power nets 104 and 105 routed within substrate 106, respectively. In some embodiments, power nets 101 and 102 routed within PFB die 103 may be coupled to extra-die power nets 104 and 105, as shown, whereby corresponding power levels (e.g., Vcc1 and Vcc2) are coupled to each net. In some embodiments, power nets 104 and 105 are interconnected to an external power source through a PCB. Voltage regulators on-board dies 107 and 108 may locally convert the voltage supplied through extra die power nets 104 and 105 to Vcc1 and Vcc2. Voltages Vcc1 and Vcc2 may be dynamically regulated according to bus conditions within dies 107 and 108.

PFB die 103 may comprise multiple metallization layers labelled in vertically descending order as M5, M4, M3, M2 and M1, for example. Metallization layers M5-M1 may comprise traces and interconnect pads patterned in copper layers ranging in thickness between 0.5 and 5 microns. Metal layers M5-M1 are separated by dielectric layers (not shown), described below. Die 107 [die1] and die 108 [die2] coupled to PFB 103 as shown in FIG. 1, may oppose each other across the width of the PFB die 103. in y-direction of the figure.

Figure 2A:
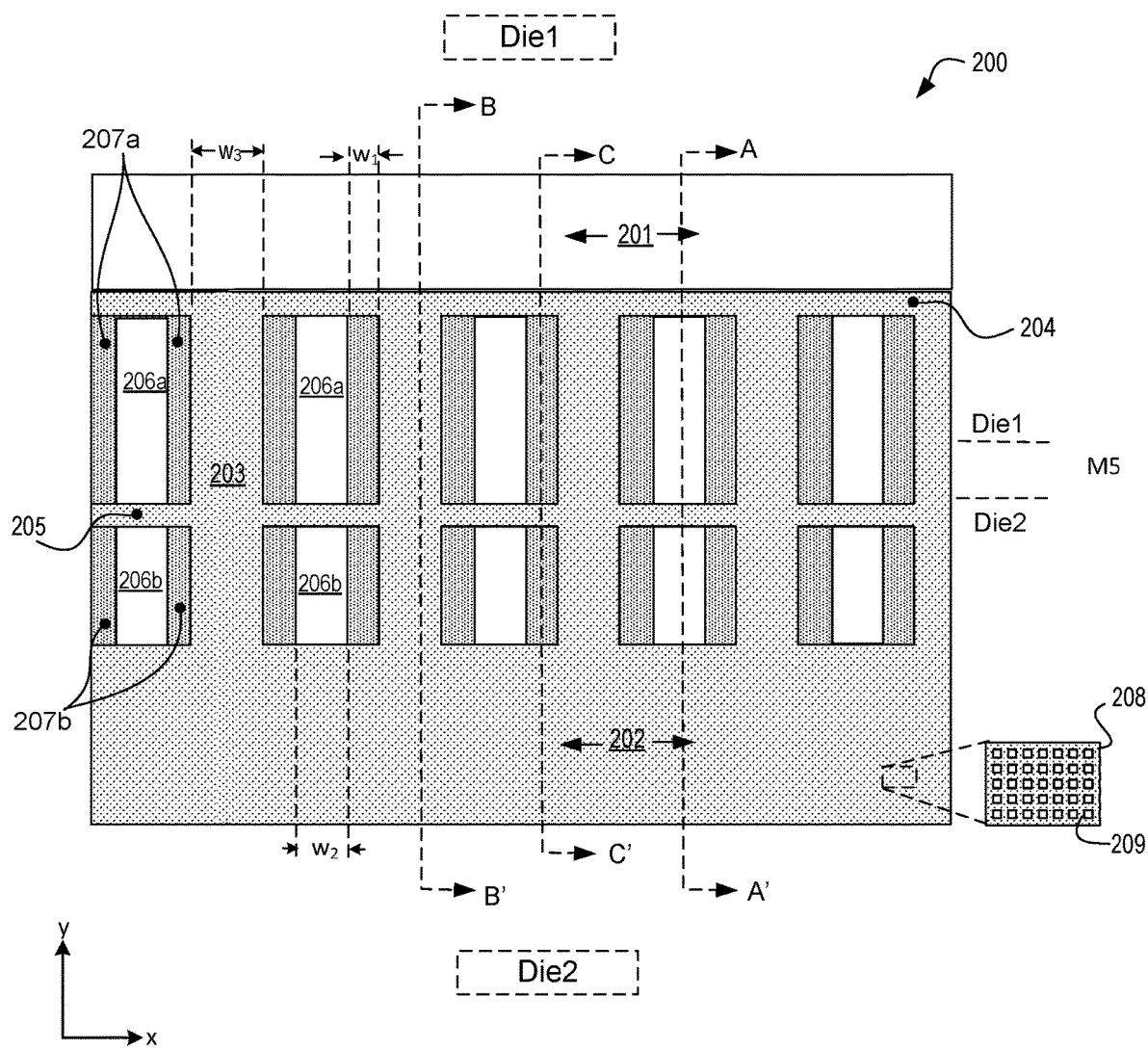
FIG. 2A illustrates a plan view in the x-y plane of a first metallization layer of a power-forwarding bridge die, according to some embodiments of the disclosure.
Figure 2B:
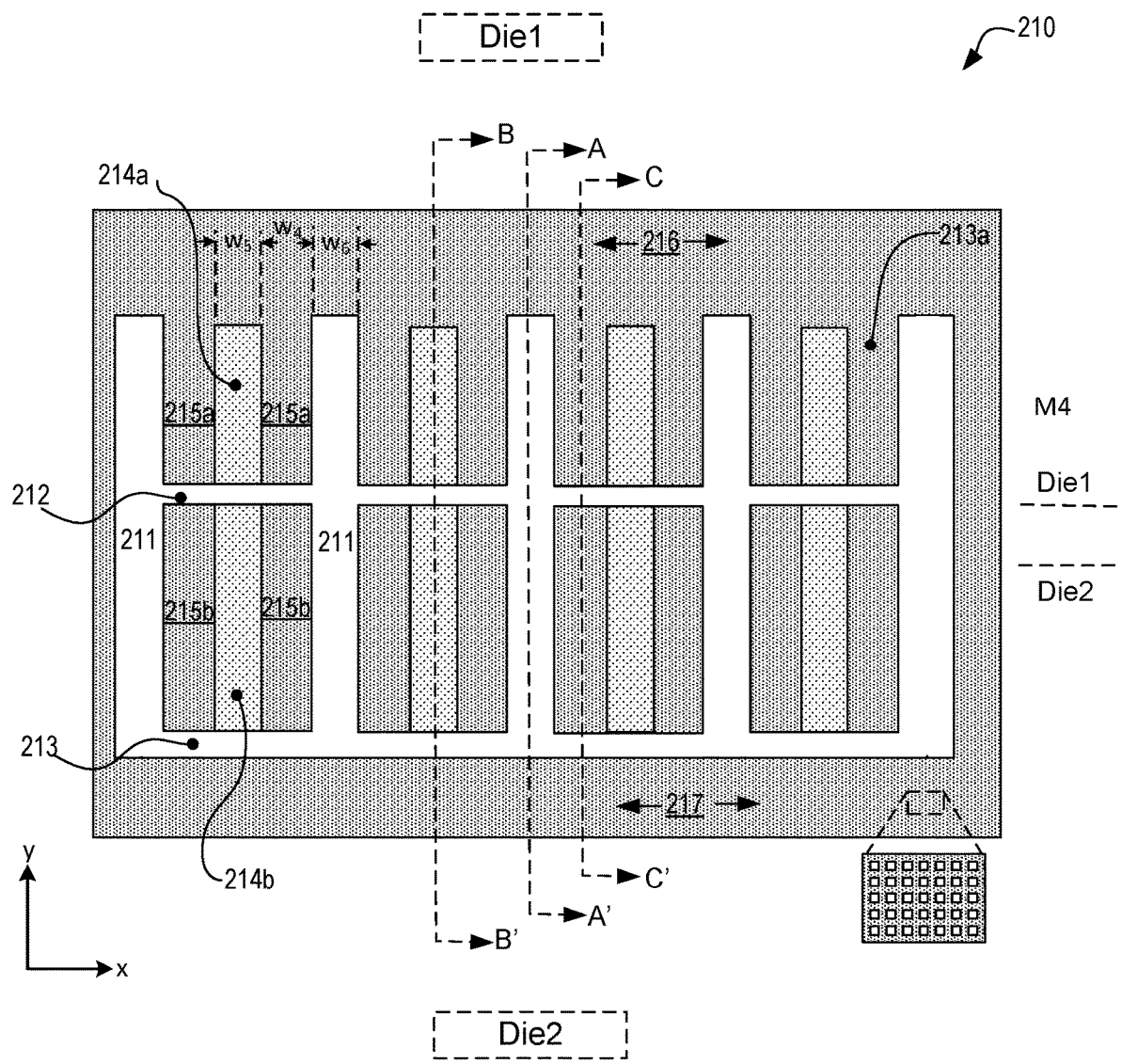
FIG. 2B illustrates a plan view in the x-y plane of a second metallization layer of a power-forwarding bridge die, according to some embodiments of the disclosure.

FIGS. 2A and 2B illustrate plan views in the x-y plane of layer M5 200 and layer M4 210 of PFB die 103, respectively, according to some embodiments of the disclosure.

In FIGS. 2A and 2B, "bridge die" may refer to PFB die 103 described above. "Bridge die" may also be used in reference to layers 200 and 210 (e.g., layers M5 or M4), as width and length orientation and dimensions of layers M5 and M4 are equivalent to those of the bridge die (e.g., PFB die 103).

FIG. 2A shows metallization layer 200 (e.g., M5) of the bridge die, according to some embodiments. Vcc1 power rail 201 and Vcc2 power rail 202 extend along the length of layer M5 (e.g., in the x-direction) respectively on opposing sides of the bridge die (e.g., in the y-direction). In FIG. 2A, opposing sides of layer M5 labelled "die1" and "die2" indicate the orientation of the bridge die with respect to coupled package dies. Dashed lines on the right side of the figure indicate an example of the extent of overlap that each of die1 and die2 may have with the bridge die. Dashed rectangles labelled "die1" and "die2" in FIG. 2 may be included in the figure as visual aids to facilitate reference to opposing sides across the width of the bridge die.

Within M5, the Vcc2 power net is dominate over the Vcc1 and Vss nets. The Vcc2 power net comprises Vcc2 interdie traces 203 extending in the y-direction of the figure. Vcc2 interdie traces 203 may be coupled to power terminals for Tx2 on die2 and for Rx1 on die1 to forward power from Tx2 to Rx1. In some embodiments, Vcc2 interdie traces 203 are contiguous with Vcc2 power rail 202. Cross traces 204 and 205 extend laterally (e.g., in the x-direction) and may tie together Vcc2 interdie traces 203 in a grid comprising cross traces 204 and 205. Cross traces 204 and 205 may couple low power circuitry on die1 and die2 to the Vcc2 power net.

Vcc2 cross traces 205 extend between Vcc1 interdie traces 206a-b and Vss interdie traces 207a-b, electrically isolating the "a" portion of each interdie trace from the "b" portion. Vcc1 interdie traces 206a may be electrically shorted to Vcc1 interdie traces 206b by vertical interconnects extending into adjacent layers, as shown in FIG. 4A. In a similar manner, Vss interdie traces 207a and 207b may be electrically shorted together and coupled to the Vss net by vertical interconnects, as shown in FIG. 4C.

Vcc1 interdie traces 206a and 206b (206a-b) are parallel to Vcc2 interdie traces 203, and adjacent to Vss interdie traces 207a and 207b (207a-b). Vss interdie traces 207a-b may be located between Vcc1 and Vcc2 interdie traces 203 and 206a-b.

Location of Vss interdie traces 207a-b in between Vcc2 and Vcc1 interdie power traces 203 and 206a-b may facilitate suppression of power noise cross-talk. In the illustrated embodiment, Vss interdie ground traces 207a-b have a width w1 that is less than widths w2 of Vcc1 interdie traces 206a-b and w3 of Vcc2 interdie power traces 203. Widths w1, w2 and w3 may be adjusted to minimize mutual electromagnetic coupling between coplanar power traces and to reduce power net noise cross-talk. Vss interdie traces 207a-b are referenced to ground potential.

The inset of FIG. 2A shows an enlargement of an exemplary grid microstructure of metallization in Vcc2 power rail 202. The grid microstructure comprises orthogonal lines 208 and 209, respectively extending in the x and y directions of the figure. The grid microstructure shown in the inset may also be incorporated in Vcc1 power net and Vss ground net metallization in all layers M5-M1 of the bridge die.

Referring now to FIG. 2B, the Vcc1 power net within layer 210 (e.g., layer M4) comprises interdie traces 211 extending in the y-direction, joined together into a grid network by Vcc1 cross traces 212 and 213 and extending laterally between Vcc1 interdie traces 211. Vcc1 interdie traces 211 may interconnect power ports for Tx1 on die1 and power ports for Rx2 on die2 to forward power from Tx1 to Rx2. Vcc1 cross traces 212 may access low power circuitry in die1 and/or die2. Vcc1 interdie traces 211 may be aligned to Vcc1 interdie traces 206a and 206b in M5. Vias (not shown) may vertically interconnect Vcc1 interdie traces 211 to Vcc1 interdie traces 206a and 206b in M5, as described below.

The Vcc2 power net within layer M4 comprises Vcc2 interdie traces 214a and 214b between adjacent Vss interdie traces 215a and 215b. Vss interdie traces 215a-b intervene between Vcc1 and Vcc2 interdie traces 211 and 214a-b, respectively. While Vcc2 interdie traces 214a-b are separated by Vcc1 cross trace 212. Vcc2 interdie traces 214a-b may be coupled to each other and to the Vcc2 power net by cross-layer interconnection to Vcc2 interdie traces 203 in M5, for example.

The Vss ground net within M4 comprises Vss rails 216 and 217 extending laterally along the die1 and die2 edges of M4, respectively. In the illustrated embodiment, Vss rail 216 is contiguous with Vss interdie traces 215a. Vss interdie trace 215b is separated from Vss interdie trace 215a by Vcc1 cross trace 212.

As noted above, Vcc1, Vcc2 and Vss interdie traces in M4 may be aligned and vertically interconnected to corresponding interdie traces within M5. For example, Vcc1 interdie traces 206a-b in M5 may be aligned to Vcc1 interdie traces 211 in M4. Vss interdie traces 207a-b in M5 may be aligned to Vss interdie traces 215a-b in M4. Vcc2 interdie traces 203 in M5 may be aligned to Vss interdie traces 213a-b in M4. Vertical interconnection between corresponding structures in layers M5 and M4 are described below and shown in FIGS. 4A-4C.

Positioning Vss interdie traces 215a-b between adjacent Vcc1 and Vcc2 interdie traces 211 and 214a-b, respectively, may suppress electromagnetic coupling between the Vcc1 and Vcc2 power nets within M4, reducing cross-talk between the Vcc1 and Vcc2 power nets. Interdie trace widths may be inverted with respect to widths of corresponding interdie trace widths in M5 to reduce loop impedance. The larger width w4 of Vss interdie traces 215a-b within M4 may enhance cross-layer electromagnetic coupling of Vcc1 and/or Vcc2 interdie traces 203 and 206a-b in M5 to the Vss net. Enhanced cross-layer electromagnetic coupling between power nets and the Vss net may further reduce power net noise and cross-talk.

For example, Vss interdie traces 215a-b in M4 have a width w4 that is greater than width w1 of corresponding Vss interdie traces 207a-b in layer M5. Vcc2 interdie traces 203 in M5 may be wider than corresponding Vcc2 interdie traces 214a-b (e.g., width w3>width w5). Vcc1 interdie traces 206a-b in M5 may be wider than corresponding Vcc1 interdie traces 211 in M4 (e.g., w2>w6). The larger width of Vss interdie traces 215a-b in layer M4 may increase electromagnetic coupling between Vcc1 and Vcc2 interdie traces and Vss interdie traces. Noise on the Vcc1 and Vcc2 interdie traces may be suppressed by enhanced electromagnetic coupling of Vcc1 and Vcc2 interdie traces to ground. The greater width of the Vss interdie traces 215a-b in layer M4 may also enable reduced loop impedance of Vcc1 and Vcc2 power nets.

Figure 3A:
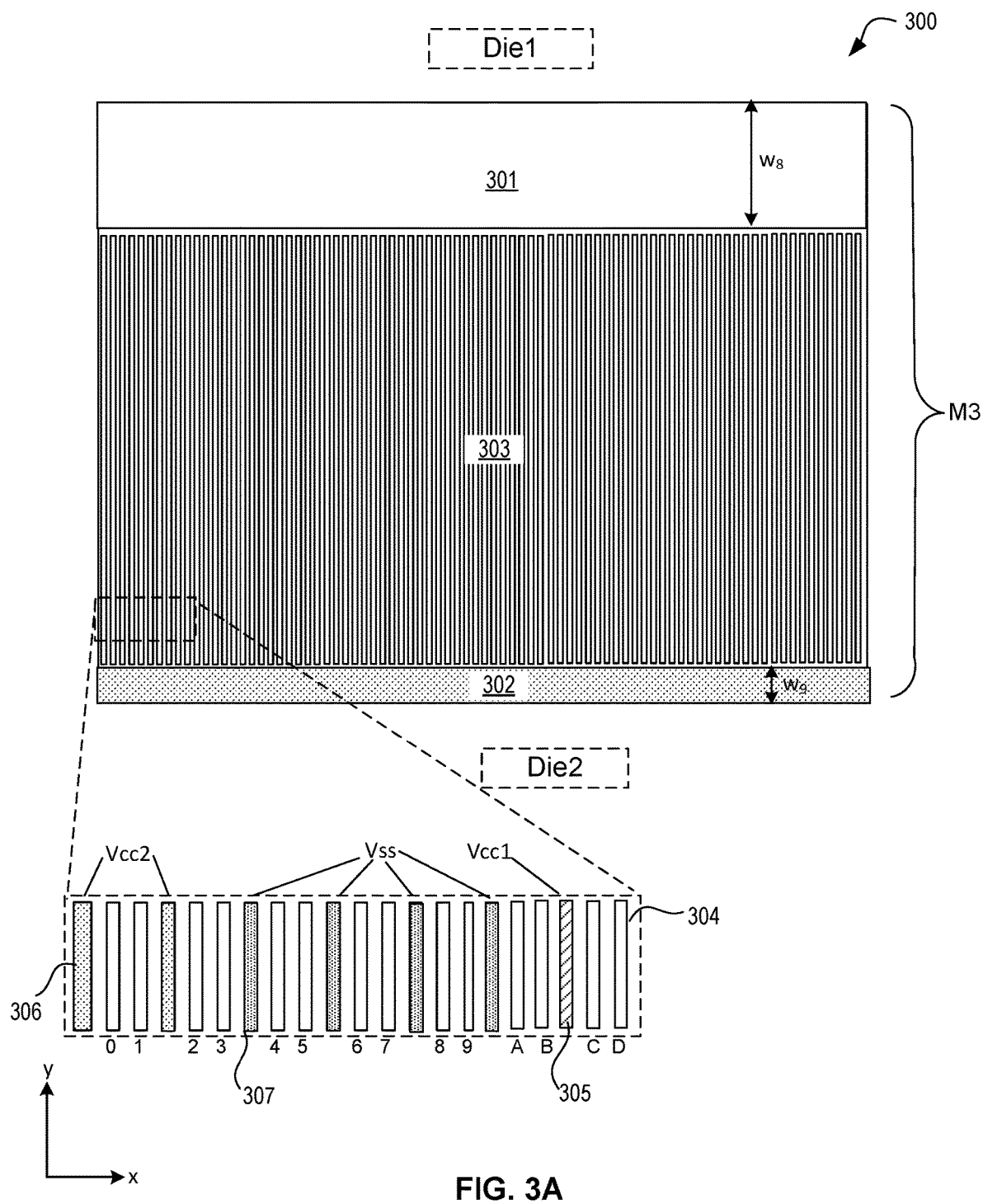
FIG. 3A illustrates a plan view in the x-y plane of third metallization layer of a power-forwarding bridge die, according to some embodiments of the disclosure.

FIG. 3A illustrates a plan view in the x-y plane of layer M3, according to some embodiments of the disclosure.

Layer M3 (e.g., layer 300) comprises Vcc1 rail branch 301 extending along the die1 edge of the bridge die (e.g., bridge die 100) and Vcc2 rail branch 302 extending along the die2 edge of the bridge die. Multiple I/O lines 303 extend between Vcc1 rail branch 301 and Vcc2 power rail branch 302. I/O lines 303 may be electrically isolated from power rails 301 and 302 by a dielectric strip (not shown) between terminals of I/O lines 303 and power rails 301 and 302. During device operation, signal lines 303 may couple I/O signals from Tx1 on die1 to Rx2 on die2 (e.g., see FIG. 1). In some embodiments, Vcc1 power rail 301 has width w8 that is significantly larger than width w9 of Vcc2 power rail 302. Differences in the power rail widths w8 and w9 may reflect the relative power distribution to die1 and die2 within M3.

Referring to the inset of FIG. 3A, an enlarged view of I/O lines 303 is shown. The line pattern shown in the inset is an enlargement of the region enclosed by the dashed box within I/O lines 303. The set of I/O lines shown in the inset may be repeated multiple times along the length of M3 in the x-direction. In some embodiments, each repeating set of I/O lines 303 comprises 14 signal lines 304, labelled in hexadecimal numbers from 0 to D (14 decimal). Seven power or ground net lines labelled Vcc1 line 305, Vcc2 lines 306 and Vss lines 307 may be interspersed between signal lines 304. In some embodiments, a power or ground net line (e.g., Vss line 307) intervenes between every pair of signal lines 304, isolating each pair of signal lines 304 to mitigate signal cross talk.

Figure 3B:
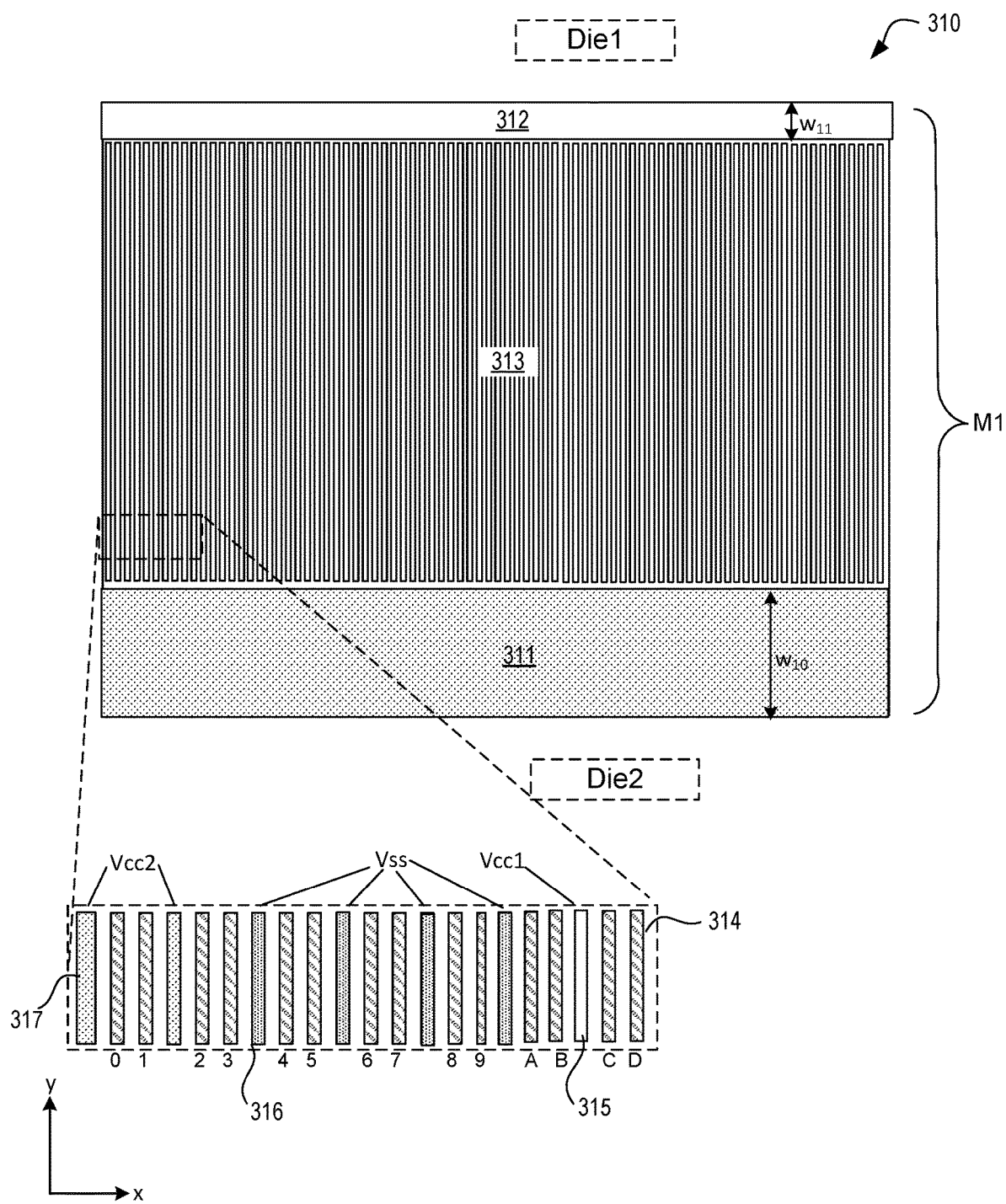
FIG. 3B illustrates a plan view in the x-y plane of a fourth metallization layer of a power-forwarding bridge die, according to some embodiments of the disclosure.

FIG. 3B illustrates a plan view in the x-y plane of layer M1, according to some embodiments of the disclosure.

The metallization layout of layer M1 (layer 310) is similar to M3 with the exception that the y-axis orientation of Vcc1 and Vcc2 power rails is inverted with respect to the orientation of layer M3. In the illustrated embodiment, width w10 of Vcc2 power rail 311 on the die2 edge is greater than width w11 of Vcc1 power rail 312 on the die1 edge of M1. Within M1, Vcc2 power rail branch 311 may carry greater amounts of current (e.g., to couple to die2) than is needed by Vcc1 power rail branch 312 (e.g., to couple to die1). The dominance of Vcc2 power net metallization in M1 may balance the dominance of Vcc1 power net metallization in M3, described above.

I/O lines 312 extend between Vcc2 power rail 311 and Vcc1 power rail 312. The inset in FIG. 3B shows an enlarged view of the region enclosed by the dashed box within I/O lines 313. I/O lines 313 comprises pairs of signal lines 314 flanked by power or ground net lines 315, 316, 317. Power and ground net lines may include Vss ground net lines 316, Vcc1 power net lines 315 and Vcc2 power net lines 317. Power and ground net lines 315, 316 and 317 are between adjacent pairs of I/O signal lines 314 (labelled 0-D hex, 0-14 decimal) to minimize signal cross talk between signal lines 314.

FIG. 4A illustrates a cross-sectional view in the y-z plane of Vcc1 net 400 in power forwarding bridge die 100, showing vertical interconnections between Vcc1 structures in layers M5-M1, according to some embodiments of the disclosure.

The cross-sectional view shown in FIG. 4A may be taken along y-z plane A-A' in FIGS. 2A and 2B. In FIG. 4A, exemplary vertical interconnections of the Vcc1 power net branches in layers M5 through M1 of the bridge die (e.g., PFB die 103) are shown. Metallization structures in layers M5-M1 may comprise patterned copper layers between interlayers of dielectric material 401. In some embodiments, dielectric material 401 comprises silicon oxides, silicon nitrides, or silicon carbides. In addition to Vcc1 net metallization structures. Description of vertical interconnection within the Vcc2 and Vss nets is reserved for the discussion below relating to FIGS. 4B and 4C.

Top-level interconnect pads 402 are electrically coupled to Vcc1 structures in M5 (e.g., Vcc1 interdie traces 206a and 206b), Vcc1 power rail 201 through vias 403. Vcc1 power rail 201, Vcc1 interdie traces 206a and 206b in M5 are interconnected by multiple vias 404 to Vcc1 interdie trace 208 spanning across a large portion of M4. Vcc1 interdie traces 206a and 206b in M5 are electrically shorted together through multiple vias 404 coupled to Vcc1 interdie trace 208 in M4.

A cascade of layer interconnections between Vcc1 net structures in lower layers (e.g., Vcc1 interdie trace 208 in M4, Vcc1 power rail branches 301 and 311 respectively in M3 and M1). Vcc1 metallization structures (e.g., Vcc1 power rails 301 and 311 in lower layers M3 and M1 are interconnected to M4 structures by via 405, and to each other by vias 406 and 407. Landing pad 408 in M2 is part of a via stack comprising vias 406 and 407. Via 407 extends between Vcc1 power rail 311 in M1 and landing pad 408 in M2, and via 406 extends between landing pad 408 in M2 and Vcc1 power rail in M3. The via stack may interconnect Vcc1 power rail 311 in M1 to the Vcc1 power net. Landing pad 407 may be isolated from surrounding Vss metallization 430 in M2 by gaps 409 backfilled by dielectric material 401.

I/O signal lines 304 within layer M3 may be electrically isolated from Vcc1 and Vcc2 power rail 301 and 302 by gaps 410. Gaps 410 may be backfilled by dielectric material 401. I/O signal lines 314 within layer M1 may be similarly electrically isolated from Vcc1 and Vcc2 power rail branches 312 and 311 by gaps 411.

FIG. 4B illustrates a cross-sectional view in the y-z plane of Vcc2 net 420 in layers M5-M1 of PFB die 103, showing vertical interconnections between Vcc2 metallization structures in layers M5-M1, according to some embodiments of the disclosure.

The cross-sectional view illustrated in FIG. 4B may be taken along y-z plane labelled B-B' in FIG. 2B. Exemplary vertical interconnections between Vcc2 net structures in layers M5 through M1 are shown. Vcc2 interdie trace 203 in M5 are interconnected to multiple top-level pads 421 to through vias 422. Interconnections between layers M5 and M4 may be made by vias 423, coupling interdie trace 203 in M5 to Vcc2 interdie traces 210a and 210b. Vcc2 interdie traces 210a and 210b in M4 may be shorted together by vias 423 coupled to Vcc2 interdie trace 203 in M5.

Vias 424, 425 and 426 may cascade interconnections to Vcc2 metallization structures in lower layers M3 through M1. For example, Vcc2 power rail 302 in M3 and 311 in M1 may be interconnected to top-level interconnect pads 421 through a via stack comprising vias 422 through 426. Landing pads 427 and 428 enable vertical interconnects to bypass Vss ground plane 430 within layer M2 and Vss rail 312 in M4.

FIG. 4C illustrates a cross-sectional view in the y-z plane of the Vss net 450 in layers M5-M1, according to some embodiments of the disclosure.

The cross-sectional view illustrated in FIG. 4C may be taken from y-z plane C-C' in FIGS. 2A and 2B. Exemplary vertical interconnection between Vss net structures in layer M5-M1 are shown.

Vss interdie traces 207a and 207b in M5 are interconnected to top-level pads 452 by vias 451. Vias 453 interconnect Vss interdie traces 215a and 215b in M4 to interdie traces 207a and 207b in M5. Vias 453 enable cross-layer coupling of isolated Vss structures, for example by bridging over Vcc1 lateral traces 212 and 213 in M4 that cross through the Vss interdie traces in M4 and may isolate them from the rest of the Vss ground net. Vss interdie traces 215a and 215b in M4 may be shorted together through Vss interdie trace 212a in M5. Vss interdie traces 215a and 215b are further shorted to Vss rail branch 214, from which they are isolated in M4, through Vss interdie trace 212b in M5.

Ground plane 430 in M2 may be interconnected to the Vss ground net by vias 454 and 455, bridging layer M3. Vias 454 and 455 may pass through Vcc2 power rail 302 by landing pad 456.

Figure 5A:
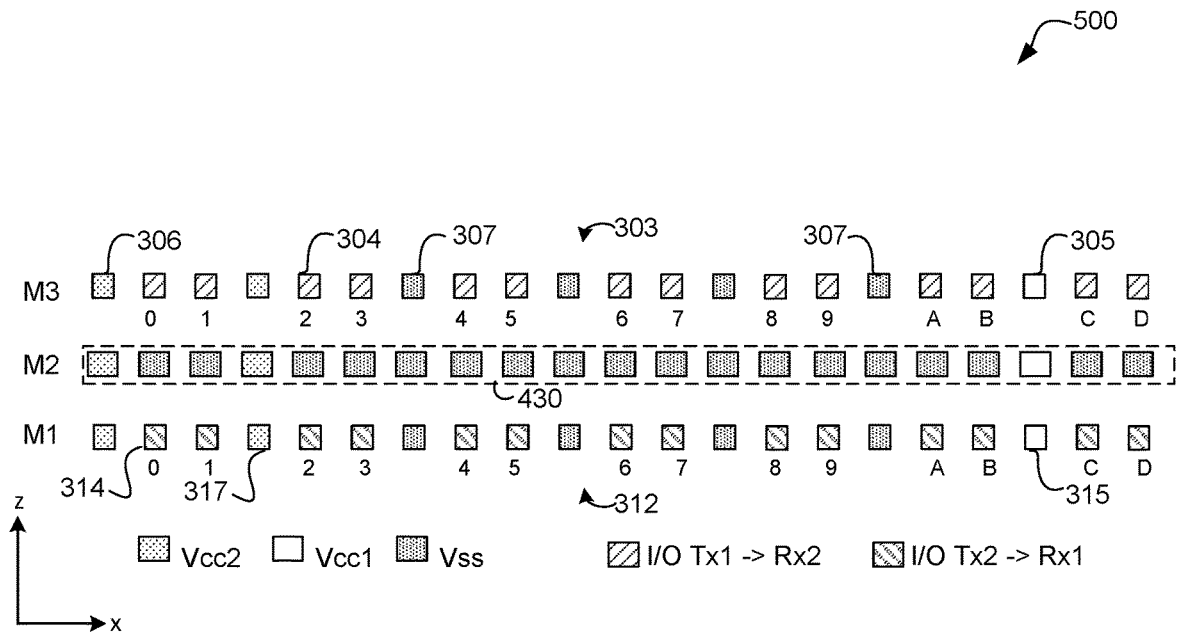
FIG. 5A illustrates a cross-sectional view in the x-z plane of a first configuration of I/O signal lines within a power-forwarding bridge die, according to some embodiments of the disclosure.
Figure 5B:
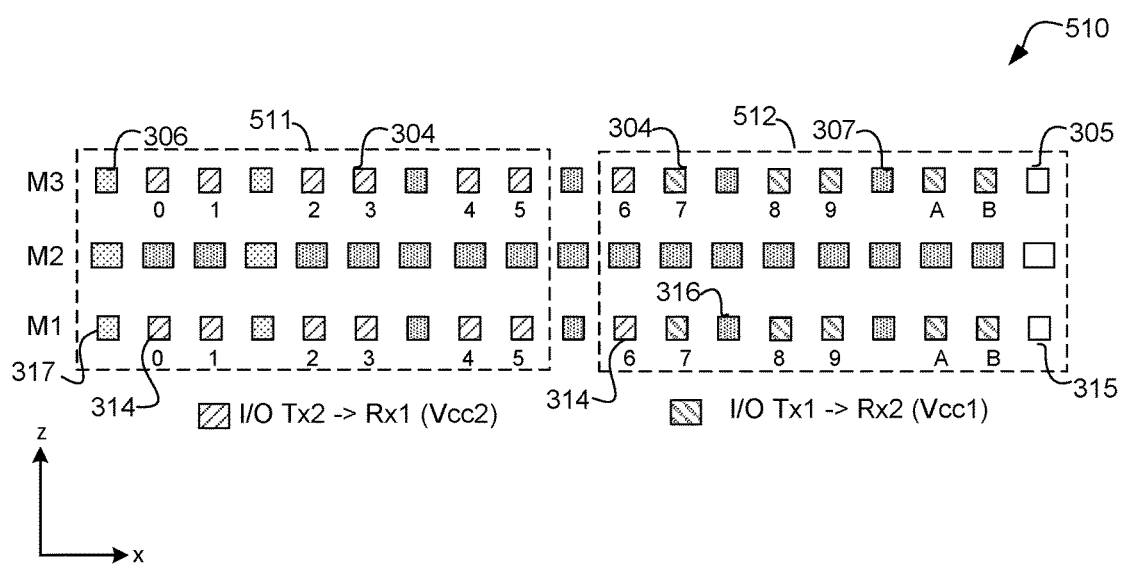
FIG. 5B illustrates a cross-sectional view in the x-z plane of a second configuration of I/O signal lines within a power-forwarding bridge die, according to some embodiments of the disclosure.

FIGS. 5A and 5B illustrate cross-sectional views in the x-z plane of I/O line configurations 500 and 510 within M3 and M1, respectively, according to some embodiments of the disclosure.

FIG. 5A shows a cross section of a portion of I/O lines 303 in M3 and I/O lines 313 in M1. In the illustrated embodiment, the portion comprises 14 individual signal lines 304 in layer M3 (e.g., having rising diagonal hatch shading in layer M3) and 14 signal lines 314 (e.g., having descending diagonal hatch shading in layer M1). Signal lines 304 and 314 in M3 and M1, respectively, are numbered hexadecimally from 0-D (e.g., as shown in the insets of FIGS. 3A and 3B). Pairs of signal lines 304 and 314 may be flanked by Vss lines 307. In some embodiments, Vcc1 lines 305, 315 and Vcc2 lines 306, 317 may also be adjacent to signal lines 304 and 314 in both M3 and M1, respectively.

In I/O line configuration 500, all signal lines 304 in M3 (e.g., lines 0-D) may be coupled to signal output ports on Tx1 and to signal input ports on Rx2. During device operation, all signal lines 304 within M3 may transfer digital signals unidirectionally from Tx1 on die1 to Rx2 on die2. Signals on signal lines 304 may be referenced to voltage Vcc1 (e.g., 1V). Conversely, all signal lines 314 (e.g., labelled 0-D) within M1 may be coupled to signal output ports for Tx2 on die2 and to signal input ports for Rx1 on die1. During device operation, all signal lines 314 labelled 0-D in M1 may transfer signals unidirectionally from Tx2 on die2 to Rx1 on die1.

FIG. 5B includes a legend to explain cross-sectional shading. Signal lines 304 and 314 are shaded by right-leaning and left-leaning cross hatch fill to indicate Tx1→Rx2 and Tx2→Rx1 signal I/O port assignments, respectively.

For configuration 510 shown in FIG. 5B, signal-carrying assignments for signal lines 304 and 314 are split into two groups within both layers M3 and M1. Groups having the same I/O direction are combined into separate blocks 511 and 512. Signal lines 304 and 314 that are numbered 0-5 are combined into block 511 and configured to deliver digital signals from Tx2 to Rx1. They are only adjacent to Vcc2 power net. Block 512 comprises signal lines 304 and 314 numbered 6-B (e.g., the second half) assigned to deliver digital signals from Tx1 to Rx2. They are adjacent to Vcc1 power net lines 505, and Vss lines 307 and 316 in Me3 and M1, respectively within block 512. The signals are isolated from the irrelevant power net to avoid the undesired power noise coupling.

Figure 6:
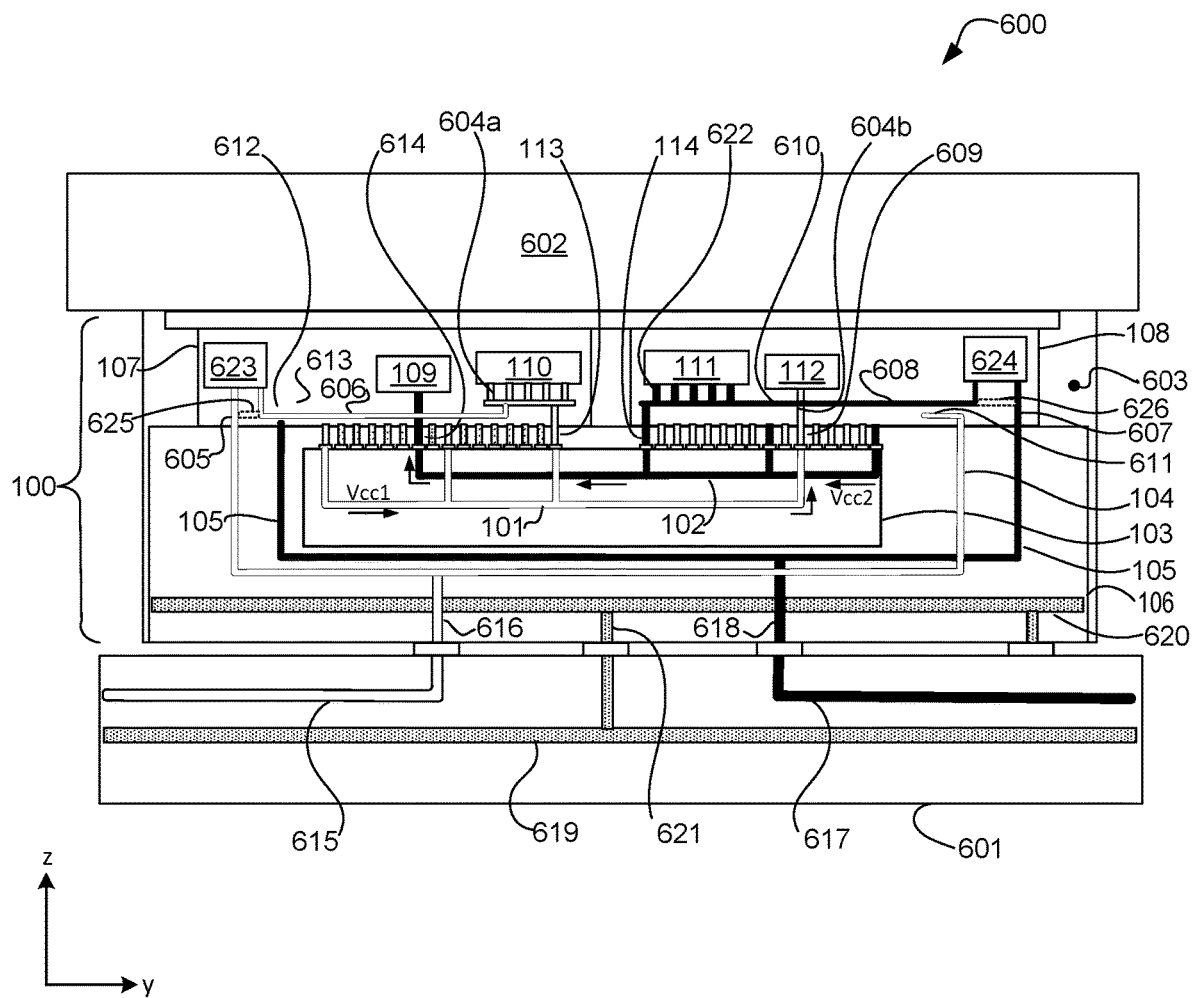
FIG. 6 illustrates a cross-sectional view in the y-z plane of a device comprising a package having a power-forwarding bridge die, according to some embodiments of the disclosure.

FIG. 6 illustrates a cross-sectional view in the y-z plane of device 600 comprising package 100, according to some embodiments of the disclosure.

Device 600 comprises package 100 mounted on PCB 601. A heatsink 602 may be included in implantation 600. Package 100 comprises die 107 (e.g., die1) and die 108 (e.g., die2) mounted on substrate 106. Die 107 comprises I/O signal receiver 109 (Rx1) and transmitter 110 (Tx1). Die 108 comprises I/O signal transmitter 111 (Tx2) and receiver 112 (Rx2). In device 600, die 107 and die 108 may be two microprocessor (CPU) chiplets, for example.

In some embodiments, package 100 is encapsulated within molding material 603. Power forwarding bridge (PFB) die 103 is embedded within substrate 106. PFB die 103 comprises power forwarding routing 101 (white routing) and 102 (black routing). Power forwarding routing 101 may comprise Vcc1 interdie traces 206a-b in M5 and 211 in M4, respectively, shown in FIGS. 2A and 2B. Vcc1 power forwarding routing 101 on PFB 103 may couple power ports 604a of transmitter 110 (Tx1) to power interconnects 604b of receiver 112 (Rx2). Vcc1 power forwarding routing 101 on PFB 103 may be coupled to Vcc1 power rail 606 on die 107 (die1) and to Vcc1 power rail 611 on die 108 by vertical interconnects 113 and 609, respectively.

Power forwarding routing 102 on PFB die 103 (e.g., comprising Vcc2 interdie traces 203 in M5, and 214a/b in M4, FIGS. 2A-2B) couple power interconnects 622 of transmitter 111 (Tx2) to power interconnects of receiver 109 (Rx1). Power forwarding routing 102 in PFB die 103 may be coupled to transmitter 111 through vertical interconnect 114. Transmitter 111 (Tx2) may couple Vcc2 power to receiver 109 (Rx1) through PFB die 103 by power forwarding routing 102.

In an alternative embodiment, substrate-level power routing (e.g., Vcc1 power routing 104) may couple a common system-level power supply voltage derived from power rails 615 and 617 in PCB 601. Power nets 104 and 105 may couple the system voltage into package 100 through interconnects 616 and 618. Power nets 104 and 105 couple to rails 606 and 608 in dies 107 and 108 through interconnects 605 and 607. Voltage regulators 623 and 624 on dies 107 and 108 may up or down regulate the supply voltage to Vcc1 (e.g., 1V) and Vcc2 (e.g., 0.6V), respectively. As described above, PFB die 103 within package 100 may forward on-die converted power (e.g., Vcc2-level power stepped down from Vcc1 on die 108) from Tx2 transmitter 111 on die 108 to Rx1 receiver 109 on die 107 when interdie I/O is active.

In some embodiments, substrate-level power forwarding routing 104 and 105 within substrate 106 may couple Vcc1 and Vcc2 power to dies 107 and 108, bypassing voltage regulators 623 and 624 through bridges 625 and 626 (indicated by dashed traces). In the illustrated embodiment, substrate-level Vcc1 power forwarding routing 104 couples to power rail 606 on die 107 through vertical interconnect 605 to die 107. Within die 107, power rail 606 may internally distribute Vcc1 power entering die 107 to transmitter 110 (Tx1) through power interconnects 604a. Vcc1 power is subsequently forwarded to receiver 112 (Rx2), which is interconnected to Vcc1 power forwarding routing 101 through power ports 604b. Substrate-level Vcc1 power forwarding routing 104 may also enter die 108 through vertical interconnect 607 and couple directly to receiver 112 (Rx2) through power ports 604b to Vcc1 power rail 608. Substrate-level power forwarding routing 104 may couple to power forwarding routing 101 on PFB die 103 through vertical interconnect 609.

Referring again to the illustrated embodiment, substrate-level Vcc2 power-forwarding routing 105 couples to power rail 610 on die 108 through vertical interconnect 611 entering die 108. Power rail 610 may internally distribute Vcc2 power entering die 108 to transmitter 111 (Tx2) through power ports 622. Vcc2 power may be coupled from die 108 to the Vcc2 power net on PFB die 103 through vertical interconnect 114. Vcc2 power may be subsequently forwarded to receiver 109 (Rx1) on die 107 through Vcc2 power forwarding routing 102 on PFB die 103 as described above. Substrate-level Vcc2 power forwarding routing 105 may also directly enter die 107 through vertical interconnect 612 and couple directly to receiver 109 (Rx1) through power rail 613. Substrate-level power forwarding routing 104 may also couple to Vcc2 power forwarding routing 102 on PFB die 103 through vertical interconnect 614.

In some embodiments, PCB 601 may route Vcc1- and Vcc2-level power to package 100 from one or more system-level power sources coupled to PCB 601. In the illustrated embodiment, Vcc1 power rail 615 within PCB 601 is coupled to substrate-level Vcc1 power routing 104 through vertical interconnect 616. Vcc2 power rail 617 is coupled to substrate-level Vcc2 power routing 105 through vertical interconnect 618. Similarly, Vss ground 619 within PCB 601 is coupled to substrate-level Vss routing 620 through vertical interconnect 621. As noted above, Vcc1 and Vcc2 may be converted by on-board voltage regulators 623 and 624 on board dies 107 and 108 from a system voltage level generated by an external power source coupled to PCB 601 (not shown), A system-level supply voltage may be coupled to substrate-level power nets 104 and 105 through vertical interconnects 616 and 618, coupled to power rails 615 and 617 within PCB 601. Voltage regulation on dies 107 and 108 may dynamically regulate Vcc1 and Vcc2 for optimal signal transceiver performance, as Vcc1 and Vcc2 may need to vary as conditions within dies 107 and 108 change with power demands, etc.

Alternatively, Vcc2-level power may be delivered to dies 107 and 108 through substrate-level power routing 105. Vcc2-level power may be stepped up to Vcc1-level power by voltage regulation circuitry (not shown) on die 107. The converted power may be subsequently forwarded through PFB die 103 to Rx2 (e.g., receiver 112) on die 108 from Tx1 (e.g., transmitter 110) when interdie I/O is active.

Figure 7:
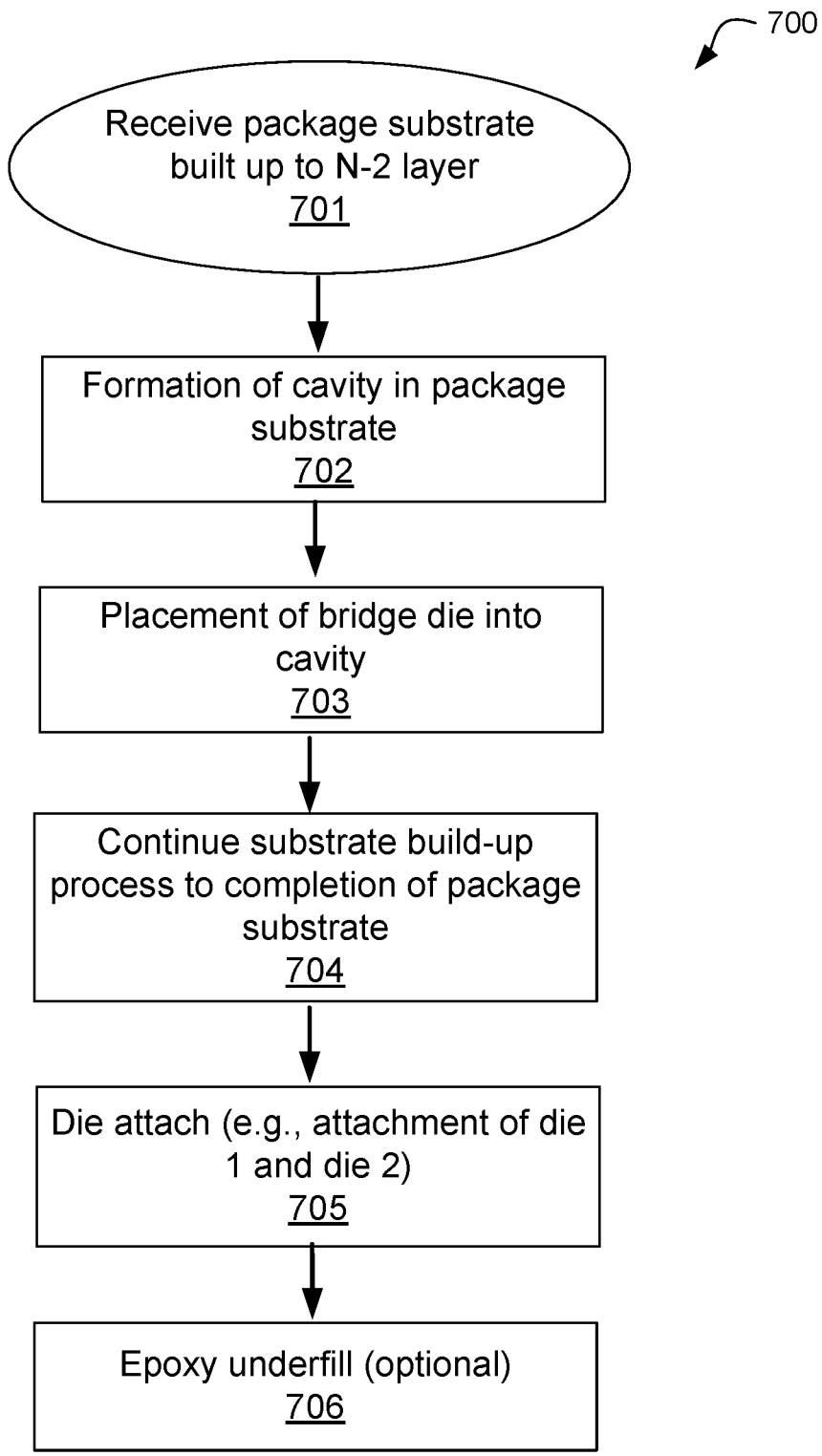
FIG. 7 illustrates an exemplary process flow chart for making an IC package comprising a power-forwarding bridge die, according to some embodiments of the disclosure.

FIG. 7 illustrates an exemplary process flow chart 700 for making package 100 comprising PFB die 103, according to some embodiments of the disclosure.

At operation 701, a partial IC package substrate (e.g., substrate 106 of package 100) is received into a back-end-of-line (BEOL) fabrication. The partial IC package substrate may be manufactured by a build-up process, where organic dielectric layers are laminated over layers of patterned copper metallization. The substrate comprises a stack of interleaved copper and dielectric layers. Each copper layer may be assigned a number, starting with the first (e.g., bottom-most) layer in the stack assigned number 1. A completed package substrate may have N layers. The as-received partial IC package substrate may be completed up to the N−2 layer.

At operation 702, a cavity is formed in the top dielectric layer of the IC package substrate. The cavity may extend between 1 mm to 15 mm on a side, and have a depth of up to 100 microns. The cavity may be formed by laser drilling process, where dielectric material is ablated to a desired depth. The cavity may be laser-drilled to the depth of a lower copper layer (e.g., N−4), where a wide copper structure such as a ground plane may be a laser stop, preventing the laser beam from penetrating deeper into the dielectric. Mechanical drilling may be substituted for laser drilling, where a fine bit (500-micron diameter) may be employed to mechanically mill the cavity.

Alternatively, the cavity may be etched by a deep reactive-ion plasma etch (DRIE) process, for example. Such a process requires masking the upper dielectric layer with a lithographically-defined photoresist or metal etch mask.

The bottom of the finished cavity may comprise exposed metallization within a lower layer (e.g., N−4) comprising a pad array for solder attachment of a power-forwarding bridge die in the subsequent operation. Pads within the cavity may be bumped with solder, or left un-bumped to receive a bridge die having a pre-bumped ball grid array (BGA), for example, on its back side to align with the pad array at the bottom of the cavity. Alternatively, the bridge die to be inserted into the cavity only has backside contacts only and exposure of buried interconnect metallization within the package substrate is not required if a flip-chip process is employed.

At operation 703, a power-forwarding bridge die (e.g., PFB die 103), manufactured in a separate fabrication line, is inserted into the cavity. While a bridge die such as PFB 103 is described in the exemplary process flow as the power-forwarding bridge, other bridging devices, such as a silicon interposer, noted above, may be substituted for a bridge die in alternative embodiments of the exemplary process flow described herein. In some embodiments, formation of a cavity may be omitted fan-out wafer-level processing. An automated pick-and-place operation may be employed for precise placement and alignment of the bridge die within the cavity. A flip-chip process may be employed if the bridge die has front-side BGA. The bridge die may be fixed in position by a solder reflow process if inserted in a flip-chip method, or by employment of an adhesive such as a capillary underfill. Alternatively, the cavity may be dimensioned to match the footprint of the bridge die with a small tolerance to prevent excessive lateral movement of the bridge die within the cavity. The cavity depth may be approximately equal to the z-height of the bridge die to enable backside contacts on the bridge die to be planar with the N−2 copper layer.

At operation 704, the package buildup process may continue. After placement of the bridge die within the cavity, one or two layers of dielectric may be laminated over the cavity to embed the bridge die. For electrical contact to backside interconnect pads on the bridge die, via openings are formed within the dielectric to expose the backside pads. Via openings may be formed by laser drilling or by mechanical drilling. Alternatively, via openings may be etched by a DRIE process. After two iterations of the build-up process, the package may be built up to copper layer N at the top level of the package substrate. Within layer N, some package top-level interconnect pads are coupled to the embedded bridge die by interlayer vias formed between layer N−2 to layer N.

At operation 705, two or more dies are attached to the completed package substrate by any suitable die attach process (e.g., flip-chip). Two dies, such as a CPU die and a memory chip, may be attached to the substrate such that the embedded bridge die is under overhanging edges of the two dies. Edges of the two dies may overhang opposite bridge die sides to align power and signal interconnect pads with corresponding interconnects on the package surface that are coupled to the bridge die. The die attach process may include a solder reflow operation to bond the dies to the package substrate.

In some embodiments, three or more dies may be linked together by a single bridge die. Multiple bridge dies may also be embedded in the substrate by the processes described above, enabling large area packages to include groups of linked dies separated by relatively large distances within the same package.

At operation 706, an epoxy underfill may be optionally added to secure the dies to the package substrate. Following addition of an underfill, the entire package may be encapsulated by an epoxy or ceramic mold material.

FIGS. 8A-8F illustrate a series of cross-sectional views in the x-z plane of an exemplary fabrication process for embedding a power-forwarding bridge die in IC package substrate 800, according to some embodiments of the disclosure.

Figure 8A:
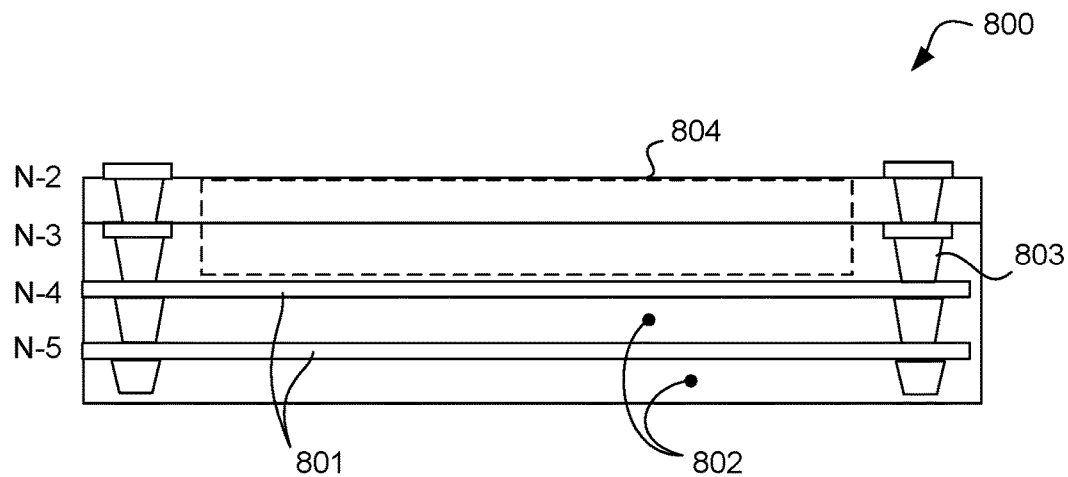
FIGS. 8A-8F illustrate a series of cross-sectional views in the y-z plane of an exemplary fabrication process for embedding a power-forwarding bridge die in an IC package substrate, according to some embodiments of the disclosure.

FIG. 8A shows a cross-sectional view of partial package substrate 800 as received into a BEOL process for embedding a power-forwarding bridge die (e.g., PFB die 103 in FIG. 1). In some embodiments, package substrate 800 comprises a stack of interleaved copper layers 801 and dielectric layers 802. In some embodiments, a package build-up process, such as a bumpless build-up layer (BBUL) process may be employed to produce substrate 800. In such a process, the substrate is built up one layer at a time with organic dielectric laminates and electroplated copper layers 801 formed over each dielectric layer 802. Other suitable processes may also be employed to form substrate 800. Received unfinished into the BEOL process line, substrate 800 may comprise N−2 copper layers. When completed, substrate 800 will comprise N copper layers 801. The bottom-most layer is numbered 1, whereas the Nth layer is the top-most layer of a competed package substrate. In the illustrated embodiment, the top-most four copper layers 801 of substrate 800, N−5 through N−2, are shown. Conductive structures (not shown) may have been patterned in lower copper layers 801 (e.g., N−4 and lower) during fabrication of substrate 800.

In addition to in-plane copper structures, substrate 800 may comprise vertical interconnects, such as vias 803, between copper layers 801. Vias 803 may be formed by electroplating copper into pre-formed holes in dielectric layers 802 between copper layers 801. In the illustrated embodiment, layer N−3 and N−2 may comprise one or more regions 804 devoid of copper within layers N−3 and N−2, where a cavity may be formed within the dielectric material in a subsequent operation.

Figure 8B:
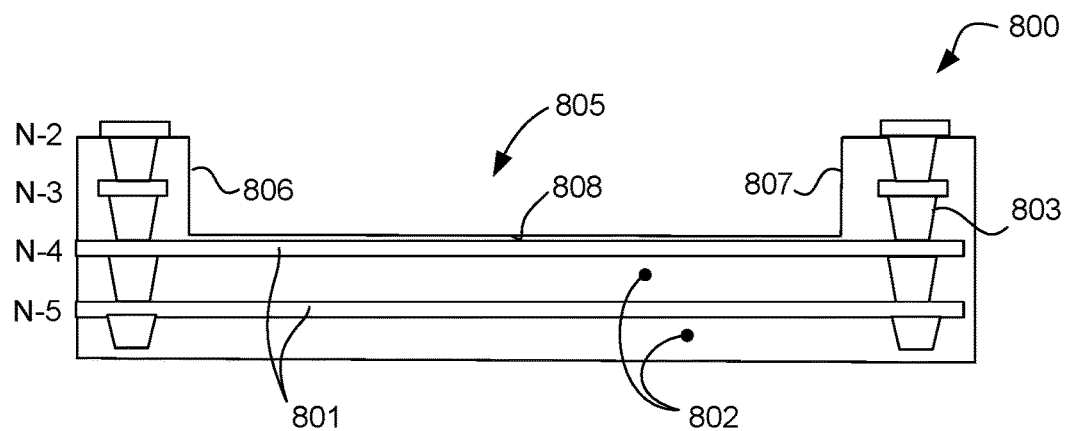

In FIG. 8B, cavity 805 is formed by a suitable process, such as laser drilling, mechanical drilling or DRIE plasma etching. Laser drilling ablates organic material from the dielectric layers 802 by employment of IR, visible or UV lasers, such as $CO_2$ lasers (e.g., 10.6 micron line), Nd:YAG lasers (e.g., 1.06 micron line), copper vapor lasers (X about 400-600 nm) or excimer lasers (X<400 nm). Openings of any shape may be formed by rastering the laser beam in a controlled pattern, such as a rectangular pattern. Depth of openings may be tens of microns to several millimeters. A buried copper structure such as a ground plane may be employed as a laser stop, preventing penetration of the beam to a greater depth within the dielectric material of substrate 800 than desired.

Depending on size, cavity 805 may be formed by mechanical drilling. Microbit diameters as small as 50 microns may be employed. Cavity 805 may be formed by mechanical milling where a microbit is rastered in a rectangular pattern. Alternatively, a DRIE etch may be employed to produce cavity 805. Such as process requires a lithographically defined etch mask.

Cavity 805 may have a rectangular shape, with lateral dimensions ranging from 1 mm to 15 mm from sidewall 806 to sidewall 807, and a depth (z-height) of up to 100 microns. In the illustrated embodiment, cavity 805 has a depth spanning two copper layers, from layer N−2 to N−4. The depth of cavity may be 100 microns. The floor 808 of cavity 805 may comprise a copper structures such as interconnect pads and traces (not shown) in layer N−4.

Figure 8C:
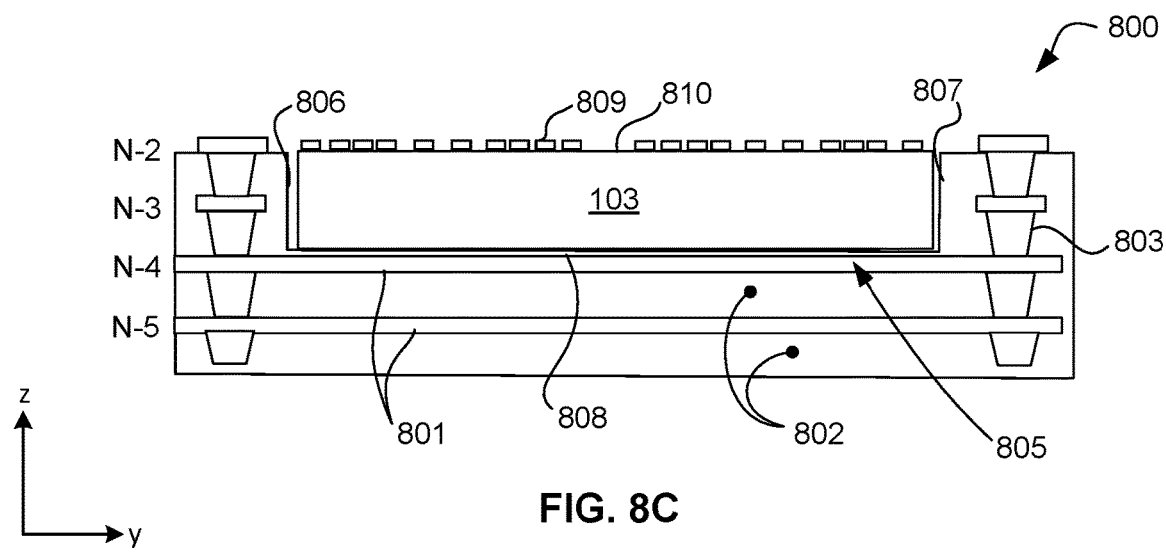

In FIG. 8C, bridge die 103 is inserted into cavity 805. A pick-and-place operation may be employed for precise placement and alignment of bridge die 103 within cavity 805. Bridge die 103 may comprise front-side or backside contacts 809 that are aligned with interconnects within N−4 copper layer 801 coplanar with cavity floor 808.

Backside or frontside contacts interfacing with floor 808 of cavity 805 may be bumped to form a ball grid array (BGA) that contacts interconnects within layer N−4 in a flip-chip type of attachment process. Bridge die 103 may be bonded to substrate 800 by solder reflow.

Alternatively, or in addition, an adhesive may be injected into spaces near sidewalls 806 and 807 of cavity 805 to seal bridge die 103 in place if solder bonding is not employed (e.g., no contacts on side interfacing with cavity bottom 808). A close tolerance between lateral dimensions of bridge die 103 and sidewalls 806 and 807 may also be employed to prevent significant displacement of bridge die 103 within cavity 805 during subsequent operations.

Contacts 809 on top surface 810 of bridge die 103 may be planar with copper level N−2.

Figure 8D:
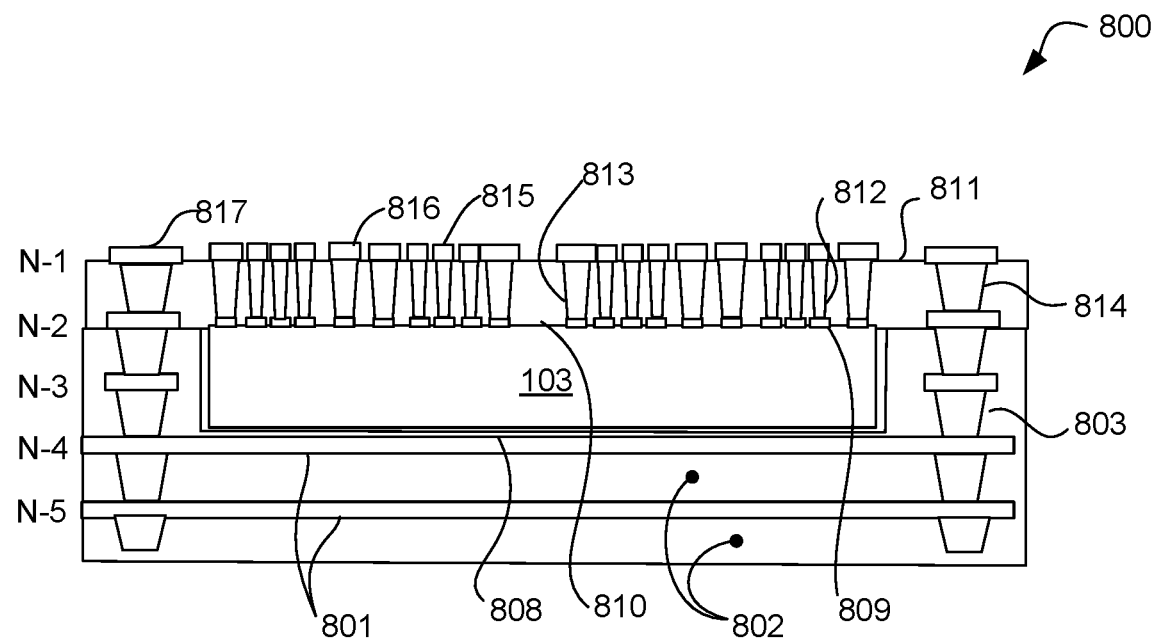

In FIG. 8D, bridge die 103 is embedded in substrate 800 by lamination of dielectric layer 811 over top surface 810 of bridge die 103. Vias 812 and 813 may be formed within dielectric layer, aligned over top-level contact pads 809 on bridge die 103. Vias 812 may be small diameter signal vias grown on top-level signal interconnect pads. Vias 813 may be larger diameter power interconnects (e.g., vertical interconnects 113, 114, 609 and 614 in FIG. 6). Large power vias 814 may also be formed within dielectric layer 811.

Copper layer N−1 may also formed by electroplating copper over dielectric layer 811 after formation of vias 812-814. Pads 815, 816 and 817 may be patterned over vias 812, 813 and 814, respectively.

Figure 8E:
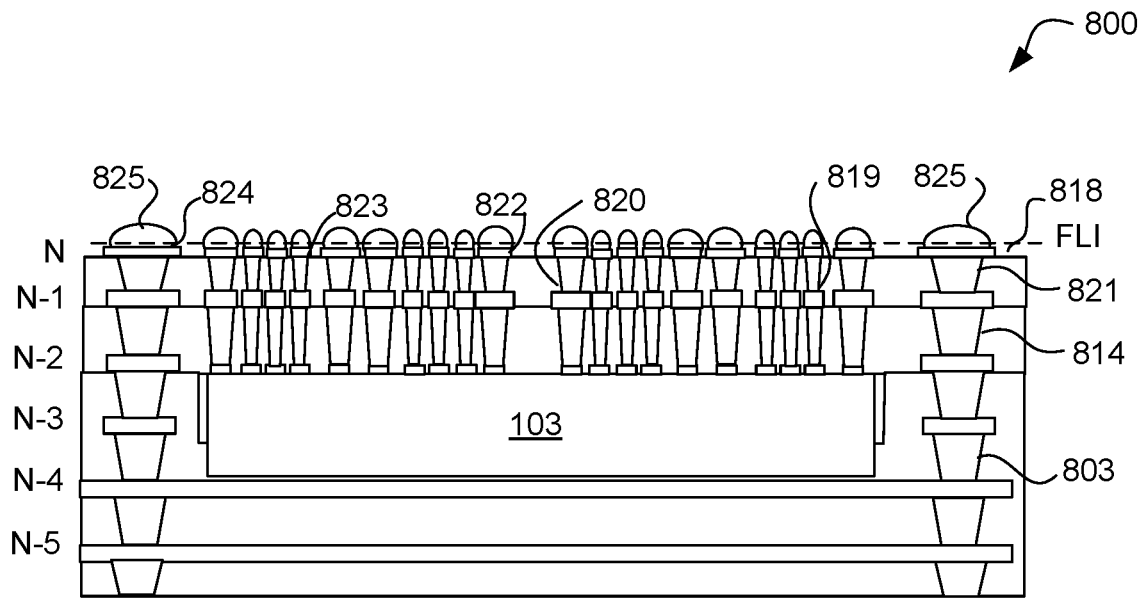

In FIG. 8E, fabrication of substrate 800 is completed with the formation of copper layer N. Dielectric layer 818 is laminated over copper layer N−1. Vias 819, 820 and 821 may be formed in dielectric layer 818 over N−1 contacts 815, 816 and 817, respectively. Copper layer N may be electroplated and patterned to form top-level interconnect pads 822, 823 and 824. A first level interconnect (FLI) layer comprising solder bumps 825 may be added over top level interconnect pads 822-824. Alternatively, the FLI layer is omitted, and die attach may be a BGA flip-chip process.

Figure 8F:
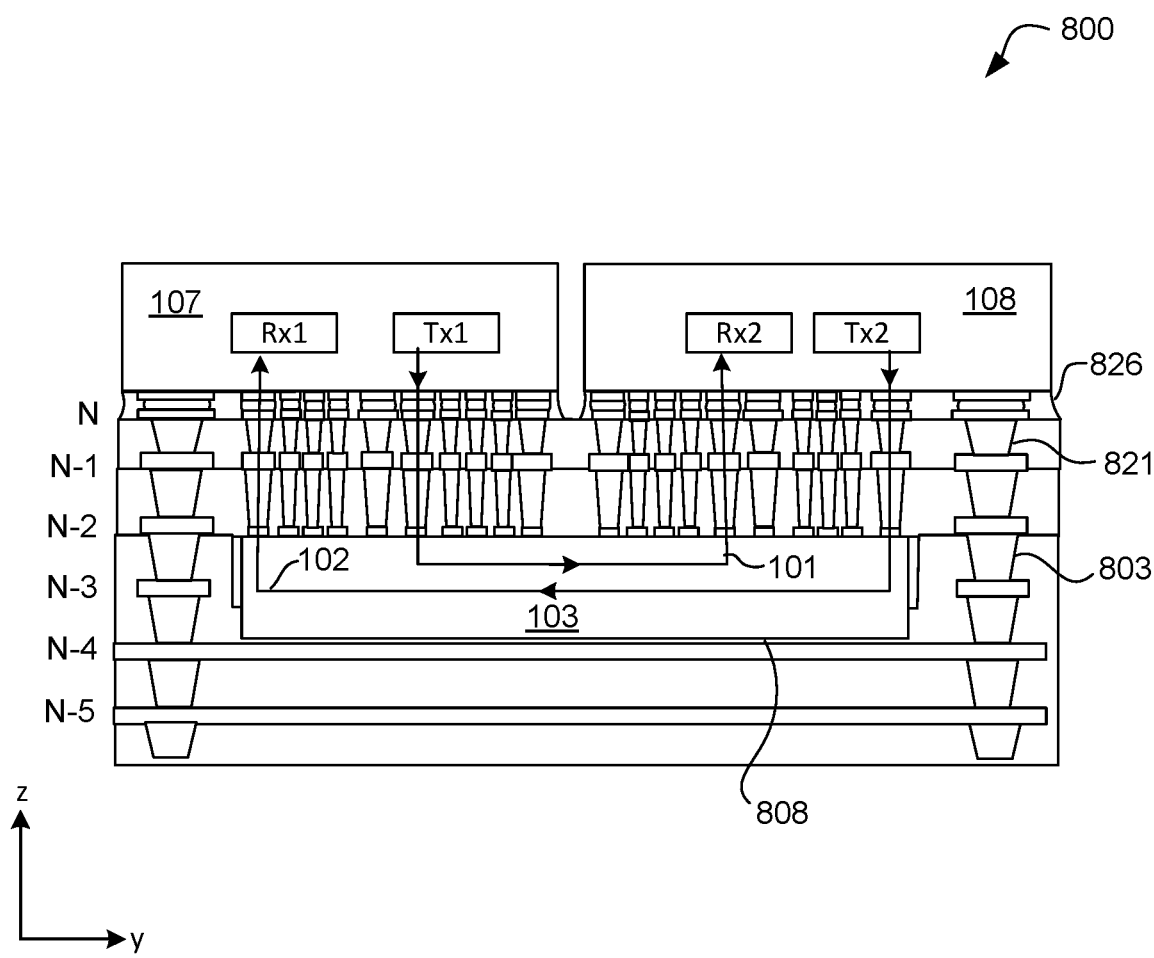

In FIG. 8F, dies 107 and 108 are attached to substrate 800. A reflow process may follow, bonding dies 107 and 108 to top-level contact pads in copper layer N. An underfill 826 may be optionally formed underneath dies 107 and 108 to reinforce solder bonds. In the illustrated embodiment, Tx1 in die 107 is coupled to Rx2 in die 108 through Vcc1 power forwarding routing 101 as indicated by the right-facing arrows in the figure. Conversely, Tx2 in die 108 is coupled to Rx1 in die 107 through Vcc2 power forwarding routing 102 within bridge die 103, as indicated by the left-facing arrows.

Figure 9:
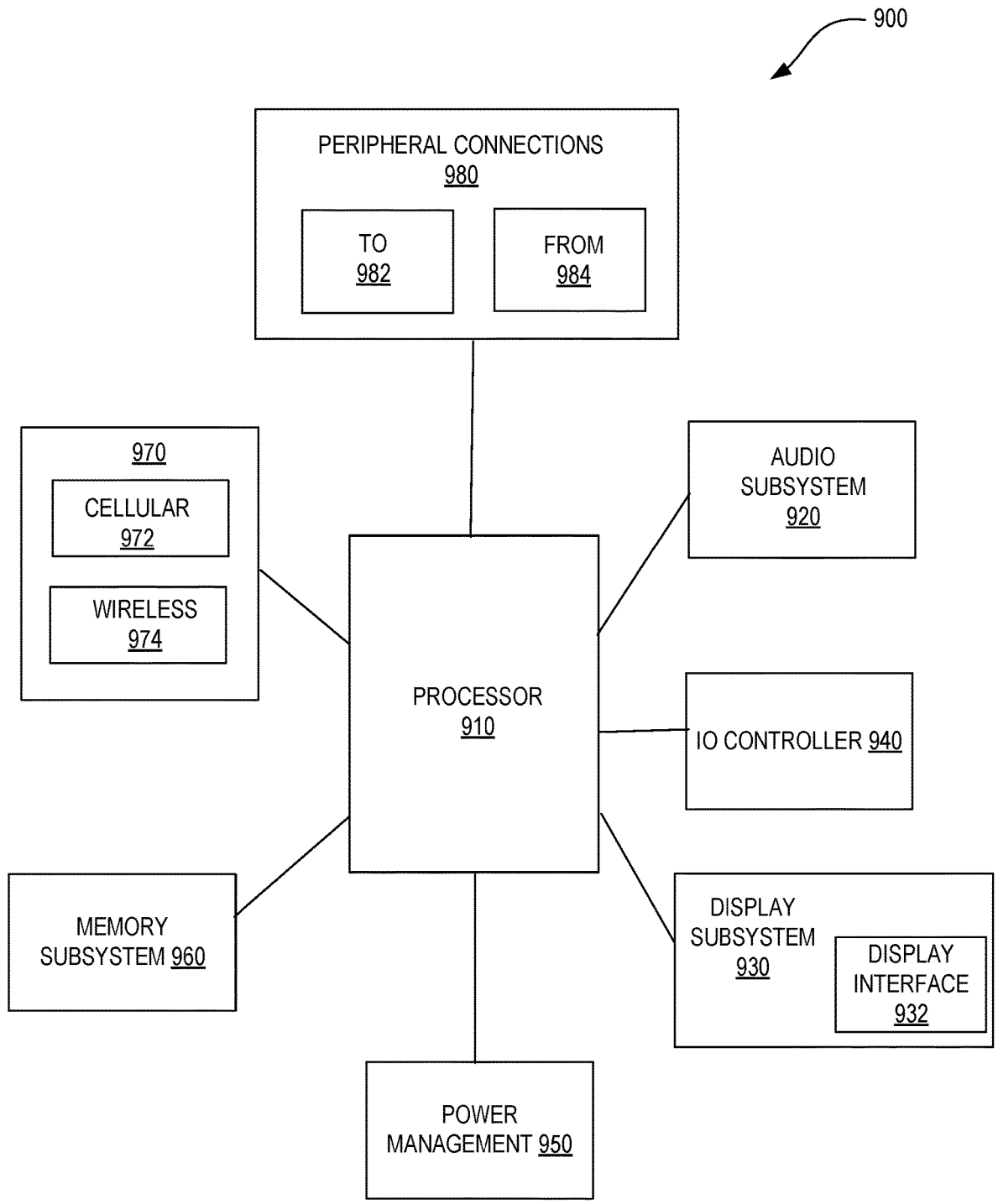
FIG. 9 illustrates a block diagram of a computing device as part of a system-on-chip (SoC) package in an implementation of IC packages comprising a power-forwarding bridge die, according to some embodiments of the disclosure.

FIG. 9 illustrates a block diagram of computing device 900 as part of a system-on-chip (SoC) package in an implementation of IC packages comprising power-forwarding bridge die 103, according to some embodiments of the disclosure.

According to some embodiments, computing device 900 represents a server, a desktop workstation, or a mobile workstation, such as, but not limited to, a laptop computer, a computing tablet, a mobile phone or smart-phone, a wireless-enabled e-reader, or other wireless mobile device. Multichip IC packages, such as, but not limited to, a single- or multi-core microprocessor (e.g., representing a central processing unit), logic dies, RF dies, high power dies, memory dies, antenna dies, comprises a packages substrate having, for example. Examples include package substrate 106 or 800 comprising PFB die 103, as disclosed herein.

In some embodiments, computing device has wireless connectivity (e.g., Bluetooth, WiFi and 5G network). It will be understood that certain components are shown generally, and not all components of such a device are shown in computing device 900.

The various embodiments of the present disclosure may also comprise a network interface within 970 such as a wireless interface so that a system embodiment may be incorporated into a wireless device, for example, cell phone or personal digital assistant. The wireless interface includes a millimeter wave generator and antenna array. The millimeter wave generator may be part of a monolithic microwave integrated circuit.

According to some embodiments, processor 910 represents a CPU or a GPU, and can include one or more physical devices, such as microprocessors, application processors, microcontrollers, programmable logic devices, or other processing means. Processor 910 may comprise a power-forwarding bridge die (e.g., PFB die 103), as disclosed. The processing operations performed by processor 910 include the execution of an operating platform or operating system on which applications and/or device functions are executed. The processing operations include operations related to I/O (input/output) with a human user or with other devices, operations related to power management, and/or operations related to connecting the computing device 900 to another device. The processing operations may also include operations related to audio I/O and/or display I/O.

In one embodiment, computing device 900 includes audio subsystem 920, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 900, or connected to the computing device 900. In one embodiment, a user interacts with the computing device 900 by providing audio commands that are received and processed by processor 910.

Display subsystem 930 represents hardware (e.g., display devices) and software (e.g., drivers) components that provide a visual and/or tactile display for a user to interact with the computing device 900. Display subsystem 930 includes display interface 932 which includes the particular screen or hardware device used to provide a display to a user. In one embodiment, display interface 932 includes logic separate from processor 910 to perform at least some processing related to the display. In one embodiment, display subsystem 930 includes a touch screen (or touch pad) device that provides both output and input to a user.

I/O controller 940 represents hardware devices and software components related to interaction with a user. I/O controller 940 is operable to manage hardware that is part of audio subsystem 920 and/or display subsystem 930. Additionally, I/O controller 940 illustrates a connection point for additional devices that connect to computing device 900 through which a user might interact with the system. For example, devices that can be attached to the computing device 900 might include microphone devices, speaker or stereo systems, video systems or other display devices, keyboard or keypad devices, or other I/O devices for use with specific applications such as card readers or other devices.

As mentioned above, I/O controller 940 can interact with audio subsystem 920 and/or display subsystem 930. For example, input through a microphone or other audio device can provide input or commands for one or more applications or functions of the computing device 900. Additionally, audio output can be provided instead of, or in addition to display output. In another example, if display subsystem 930 includes a touch screen, the display device also acts as an input device, which can be at least partially managed by I/O controller 940. There can also be additional buttons or switches on the computing device 900 to provide I/O functions managed by I/O controller 940.

In one embodiment, I/O controller 940 manages devices such as accelerometers, cameras, light sensors or other environmental sensors, or other hardware that can be included in the computing device 900. The input can be part of direct user interaction, as well as providing environmental input to the system to influence its operations (such as filtering for noise, adjusting displays for brightness detection, applying a flash for a camera, or other features).

In one embodiment, computing device 900 includes power management 950 that manages battery power usage, charging of the battery, and features related to power saving operation. Memory subsystem 960 includes memory devices for storing information in computing device 900. Memory can include nonvolatile (state does not change if power to the memory device is interrupted) and/or volatile (state is indeterminate if power to the memory device is interrupted) memory devices. Memory subsystem 960 can store application data, user data, music, photos, documents, or other data, as well as system data (whether long-term or temporary) related to the execution of the applications and functions of the computing device 900.

Elements of embodiments are also provided as a machine-readable medium (e.g., memory 960) for storing the computer-executable instructions. The machine-readable medium (e.g., memory 960) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 970 includes hardware devices (e.g., wireless and/or wired connectors and communication hardware) and software components (e.g., drivers, protocol stacks) to enable the computing device 900 to communicate with external devices. The computing device 900 could be separate devices, such as other computing devices, wireless access points or base stations, as well as peripherals such as headsets, printers, or other devices.

Network interface 970 can include multiple different types of connectivity. To generalize, the computing device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 974 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 980 include hardware interfaces and connectors, as well as software components (e.g., drivers, protocol stacks) to make peripheral connections. It will be understood that the computing device 900 could both be a peripheral device ("to" 982) to other computing devices, as well as have peripheral devices ("from" 984) connected to it. The computing device 900 commonly has a "docking" connector to connect to other computing devices for purposes such as managing (e.g., downloading and/or uploading, changing, synchronizing) content on computing device 900. Additionally, a docking connector can allow computing device 900 to connect to certain peripherals that allow the computing device 900 to control content output, for example, to audiovisual or other systems.

In addition to a proprietary docking connector or other proprietary connection hardware, the computing device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an integrated circuit (IC) package, comprising a substrate comprising a bridge die embedded within a dielectric, a first die comprising a first input/output (I/O) transmitter, a second die comprising a second I/O receiver; and a first signal trace and a first power conductor within the bridge die and each electrically coupled to the first I/O transmitter and the second I/O receiver, the first signal trace to carry a digital signal and the first power conductor to provide a voltage for the second I/O receiver to read the digital signal.

Example 2 includes all of the features of example 1, wherein a second power conductor within the bridge die is electrically coupled to the second I/O transmitter and to the first I/O receiver.

Example 3 includes all of the features of examples 1 or 2, wherein the first die is electrically coupled to a first side of the bridge die, and the second die is electrically coupled to an opposing second side of the bridge die.

Example 4 includes all of the features of example 3, wherein the first power conductor extends between the first die and the second die, wherein the first power conductor comprises a first trace in a first bridge die layer, a second trace in a second bridge die layer, and wherein the first trace is electrically coupled to the second trace.

Example 5 includes all of the features of example 4, wherein the first trace has a first width, and the second trace has a second width, and wherein the first width is smaller than the second width.

Example 6 includes all of the features of example 4, wherein the second power conductor extends between the first die and the second die and is adjacent to the first power conductor, wherein the second power conductor comprises a third trace in the first bridge die layer adjacent to the first trace, and a fourth trace in the second bridge die layer adjacent to the second trace, and wherein the third trace is electrically coupled to the fourth trace.

Example 7 includes all of the features of example 6, wherein the third trace has a third width, and the fourth trace has a fourth width, and wherein the third width is smaller than the fourth width.

Example 8 includes all of the features of example 7, wherein a third power conductor extends between the first die and the second die and is adjacent to the second power conductor, wherein the third power conductor comprises a fifth trace adjacent to the third trace in the first bridge die layer, a sixth trace adjacent to the fourth trace in the second bridge die layer, and wherein the fifth trace is electrically coupled to the sixth trace.

Example 9 includes all of the features of example 8, wherein the third power conductor is electrically coupled to a ground plane in a third layer of the bridge die.

Example 10 includes all of the features of example 9, wherein the ground plane is between a fourth bridge die layer and a fifth bridge die layer, the fourth bridge die layer comprising a first plurality of I/O signal traces, and the fifth bridge die layer comprising a second plurality of I/O signal traces.

Example 11 includes all of the features of example 10, wherein the first plurality of I/O signal traces are electrically coupled to the first transmitter and the second receiver, and the second plurality of I/O signal traces are electrically coupled to the second transmitter and the first receiver.

Example 12 includes all of the features of any one of examples 8 through 11, wherein the fifth trace has a fifth width, wherein the sixth trace has a sixth width, and wherein the sixth width is smaller than the fifth width.

Example 13 includes all of the features of any one of example 8 through 12, wherein a fourth power conductor is orthogonal to the first, second and third power conductors, wherein the fourth power conductor comprises a seventh trace in the first bridge die layer, an eighth trace in the third bridge die layer and a ninth trace in the fifth bridge die layer, and wherein the seventh trace is electrically coupled to the eighth trace and to the ninth trace.

Example 14 includes all of the features of example 13, wherein a fifth power conductor is parallel to the fourth power conductor, wherein the fifth power conductor comprises a tenth trace in the first bridge die layer, an eleventh trace in the third bridge die layer and a twelfth trace in the fifth bridge die layer, and wherein the tenth trace is electrically coupled to the eleventh trace and to the twelfth trace.

Example 15 includes all of the features of example 14, wherein the fourth power conductor and the fifth power conductor extend along opposite sides of the bridge die, and wherein the first, second and third power conductors extend between the fourth and fifth power conductors, and wherein the first, second and third power conductors are orthogonal to the fourth and fifth power conductors, wherein the fourth power conductor is electrically coupled to the first power conductor and the fifth power conductor is electrically coupled to the third power conductor.

Example 16 includes all of the features of example 15, wherein the substrate comprises a sixth power conductor and a seventh power conductor, wherein the sixth power conductor is electrically coupled to the first transmitter and the second receiver, and wherein the seventh power conductor is electrically coupled to the second transmitter and the first receiver.

Example 17 includes all of the features of example 16, wherein the sixth power conductor is electrically coupled to the first power conductor, and the seventh power conductor is electrically coupled to the second power conductor.

Example 18 includes all of the features of any one of examples 1 through 17, wherein the first die comprises a first level shifting circuit, wherein the first level shifting circuit is electrically coupled to the first receiver, wherein the second die comprises a second level shifting circuit, and wherein the second level shifting circuit is electrically coupled to the second receiver.

Example 19 is a system comprising an IC package, comprising a substrate comprising a bridge die embedded within a dielectric, a first die comprising a first input/output (I/O) transmitter, a second die comprising a second I/O receiver, a first signal trace within the bridge die and electrically coupled to a first signal port of the first I/O transmitter and a second signal port of the second I/O receiver; and a first power trace within the bridge die and electrically coupled to a first power port of the first I/O transmitter and a second power port of the second I/O receiver, the first power trace to provide the second I/O receiver a voltage from the first I/O transmitter to read a digital signal on the first signal trace, wherein the IC package is coupled to a printed circuit board.

Example 20 includes all of the features of example 19, wherein the first die is a microprocessor, and wherein the second die is a memory.

Example 21 includes all of the features of examples 19 or 20, wherein the first transmitter is coupled to a first power source having a first output voltage, and the second transmitter is coupled to a second power source having a second output voltage, wherein the first output voltage is greater than the second output voltage.

Example 22 includes all of the features of example 21, wherein the first receiver is coupled to the second output voltage on the second power conductor in the bridge die when receiving I/O signals from the second transmitter, and the second receiver is coupled to the first output voltage on the first power conductor in the bridge die when receiving I/O signals from the first transmitter.

Example 23 is a method for making an IC package, comprising receiving a partial package substrate forming a cavity within the package substrate, placing a bridge die into the cavity and embedding the bridge die; and coupling a first die and a second die to the package substrate, wherein the first die and the second die are electrically coupled to the bridge die.

Example 24 includes all of the features of example 23, wherein coupling the first die and the second die to the package substrate comprises electrically coupling a first transmitter on the first die to a second receiver on the second die.

Example 25 includes all of the features of example 24, wherein coupling the first die and the second die to the package substrate further comprises electrically coupling a second transmitter on the second die to a first receiver on the first die.

An abstract is submitted with the understanding that it will not be used to limit the scope or meaning of the claims. The following claims are hereby incorporated into the detailed description, with each claim standing on its own as a separate embodiment.

We claim:

1. An integrated circuit (IC) package apparatus, comprising:
    a bridge die embedded within a dielectric of a substrate;
    a first die comprising a first input/output (I/O) transmitter;
    a second die comprising a second I/O receiver;
    a first signal trace and a first power conductor within the bridge die and each electrically coupled to the first I/O transmitter and the second I/O receiver, the first signal trace to carry a digital signal and the first power conductor to provide a voltage for the second I/O receiver to read the digital signal; and
    a second power conductor within the bridge die electrically coupled to a second I/O transmitter of the second die and to a first I/O receiver of the first die, wherein the first power conductor extends between the first die and the second die, the first power conductor comprises a first trace in a first bridge die layer, a second trace in a second bridge die layer, and the first trace is electrically coupled to the second trace and wherein the second power conductor extends between the first die and the second die and is adjacent to the first power conductor, the second power conductor comprises a third trace in the first bridge die layer adjacent to the first trace, and a fourth trace in the second bridge die layer adjacent to the second trace, and the third trace is electrically coupled to the fourth trace.

2. The IC package apparatus of claim 1, wherein the first trace has a first width, and the second trace has a second width, and wherein the first width is smaller than the second width.

3. The IC package apparatus of claim 1, wherein the third trace has a third width, and the fourth trace has a fourth width, and wherein the third width is smaller than the fourth width.

4. The IC package apparatus of claim 3, wherein a third power conductor extends between the first die and the second die and is adjacent to the second power conductor, wherein the third power conductor comprises a fifth trace adjacent to the third trace in the first bridge die layer, a sixth trace adjacent to the fourth trace in the second bridge die layer, and wherein the fifth trace is electrically coupled to the sixth trace.

5. The IC package apparatus of claim 4, wherein the third power conductor is electrically coupled to a ground plane in a third bridge die layer of the bridge die.

6. The IC package apparatus of claim 5, wherein the ground plane is between a fourth bridge die layer and a fifth bridge die layer, the fourth bridge die layer comprising a first plurality of I/O signal traces, and the fifth bridge die layer comprising a second plurality of I/O signal traces.

7. The IC package apparatus of claim 6, wherein the first plurality of I/O signal traces are electrically coupled to the first I/O transmitter and the second I/O receiver, and the second plurality of I/O signal traces are electrically coupled to the second I/O transmitter and the first I/O receiver.

8. The IC package apparatus of claim 6, wherein a fourth power conductor is orthogonal to the first, second, and third power conductors, wherein the fourth power conductor comprises a seventh trace in the first bridge die layer, an eighth trace in the third bridge die layer, and a ninth trace in the fifth bridge die layer, and wherein the seventh trace is electrically coupled to the eighth trace and to the ninth trace.

9. The IC package apparatus of claim 8, wherein a fifth power conductor is parallel to the fourth power conductor, wherein the fifth power conductor comprises a tenth trace in the first bridge die layer, an eleventh trace in the third bridge die layer and a twelfth trace in the fifth bridge die layer, and wherein the tenth trace is electrically coupled to the eleventh trace and to the twelfth trace.

10. The IC package apparatus of claim 9, wherein the fourth power conductor and the fifth power conductor extend along opposite sides of the bridge die, and wherein the first, second and third power conductors extend between the fourth and fifth power conductors, and wherein the first, second, and third power conductors are orthogonal to the fourth and fifth power conductors, wherein the fourth power conductor is electrically coupled to the first power conductor and the fifth power conductor is electrically coupled to the third power conductor.

11. The IC package apparatus of claim 10, wherein the substrate comprises a sixth power conductor and a seventh power conductor, wherein the sixth power conductor is electrically coupled to the first I/O transmitter and the second I/O receiver, and wherein the seventh power conductor is electrically coupled to the second I/O transmitter and the first I/O receiver.

12. The IC package apparatus of claim 1, wherein the second die comprises a level shifting circuit electrically coupled to the second I/O receiver.

13. The IC package apparatus of claim 1, further comprising:
a printed circuit board coupled to the substrate.

14. An integrated circuit (IC) package apparatus, comprising:
a bridge die embedded within a dielectric of a substrate;
a first die comprising a first input/output (I/O) transmitter, the first die to operate at a first voltage;
a second die comprising a second I/O receiver, the second die to operate at a second voltage; and
a first signal trace within the bridge die and electrically coupled to a first signal port of the first I/O transmitter and a second signal port of the second I/O receiver; and
a first power trace within the bridge die and electrically coupled to a first power port of the first I/O transmitter and a second power port of the second I/O receiver, the first power trace to provide the second I/O receiver the first voltage from the first I/O transmitter and the second I/O receiver to receive a digital signal on the first signal trace using the first voltage.

15. The IC package apparatus of claim 14, wherein the first voltage is not less than 40% greater than the second voltage.

16. The IC package apparatus of claim 14, wherein the second voltage is not less than 40% greater than the first voltage.

17. The IC package apparatus of claim 14, further comprising:
a second signal trace within the bridge die and electrically coupled to a first I/O receiver of the first die and a second I/O transmitter of the second die; and
a second power trace within the bridge die and electrically coupled to the first I/O receiver and the second I/O transmitter, the second power trace to provide the first I/O receiver the second voltage from the second I/O transmitter and the first I/O receiver to receive a second digital signal on the second signal trace using the second voltage.

18. The IC package apparatus of claim 17, further comprising:
a ground plane within the bridge die and between the first signal trace and the second signal trace.

19. The IC package apparatus of claim 14, further comprising:
a printed circuit board coupled to the substrate.

20. An integrated circuit (IC) package apparatus, comprising:
a bridge die embedded within a dielectric of a substrate;
a first die comprising a first input/output (I/O) transmitter, the first die to operate at a first voltage;
a second die comprising a second I/O receiver, the second die to operate at a second voltage; and
a first signal trace and a first power conductor within the bridge die and each electrically coupled to the first I/O transmitter and the second I/O receiver, the first signal trace to carry a digital signal and the first power conductor to forward the first voltage from the first I/O transmitter to the second I/O receiver and the second I/O receiver to receive the digital signal using the first voltage.

21. The IC package apparatus of claim 20, wherein the first voltage is not less than 40% greater than the second voltage.

22. The IC package apparatus of claim 20, wherein the second voltage is not less than 40% greater than the first voltage.

23. The IC package apparatus of claim 20, further comprising:
a second signal trace and a second power conductor within the bridge die and each electrically coupled to a second I/O transmitter of the second die and a first I/O receiver of the first die, the second signal trace to carry a second digital signal and the second power conductor to forward the second voltage from the second I/O transmitter to the first I/O receiver and the first I/O receiver to receive the second digital signal using the second voltage.

24. The IC package apparatus of claim 23, further comprising:
a ground plane within the bridge die and between the first signal trace and the second signal trace.

25. The IC package apparatus of claim 20, further comprising:
a printed circuit board coupled to the substrate.

* * * * *